US012684829B2

(12) United States Patent
Suzuki

(10) Patent No.: US 12,684,829 B2
(45) Date of Patent: Jul. 14, 2026

(54) FIELD EFFECT TRANSISTOR

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventor: Ryota Suzuki, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 383 days.

(21) Appl. No.: 18/419,973

(22) Filed: Jan. 23, 2024

(65) Prior Publication Data

US 2024/0321951 A1 Sep. 26, 2024

(30) Foreign Application Priority Data

Mar. 24, 2023 (JP) ................................. 2023-048629

(51) Int. Cl.
| | |
|---|---|
| *H10D 62/10* | (2025.01) |
| *H10D 12/01* | (2025.01) |
| *H10D 30/66* | (2025.01) |
| *H10D 62/832* | (2025.01) |
| *H10P 30/20* | (2026.01) |

(52) U.S. Cl.
CPC ......... *H10D 62/111* (2025.01); *H10D 12/031* (2025.01); *H10D 30/668* (2025.01); *H10D 62/127* (2025.01); *H10D 62/8325* (2025.01); *H10P 30/2042* (2026.01); *H10P 30/21* (2026.01)

(58) Field of Classification Search
None
See application file for complete search history.

(56) References Cited

U.S. PATENT DOCUMENTS

| | | | |
|---|---|---|---|
| 2009/0200559 A1 | 8/2009 | Suzuki et al. | |
| 2023/0361171 A1* | 11/2023 | Takaya | H10D 30/668 |
| 2023/0369484 A1* | 11/2023 | Takaya | H10D 30/665 |
| 2025/0040205 A1* | 1/2025 | Takaya | H10D 12/031 |

FOREIGN PATENT DOCUMENTS

JP 2022-140217 A 9/2022

* cited by examiner

*Primary Examiner* — Jack S Chen
(74) *Attorney, Agent, or Firm* — Posz Law Group, PLC

(57) ABSTRACT

In a field effect transistor, trench lower layers are disposed directly below corresponding trenches. Deep layers of p-type extend along a first direction intersecting the trenches and are arranged at intervals along a second direction orthogonal to the first direction. A drain-side layer of n-type is distributed from a position in contact with a lower surface of a body layer to a position below a lower end of each of the deep layers through intervals between the deep layers. The drain-side layer includes a high concentration layer distributed in at least a part of a depth range in which both the deep layers and the trench lower layers are present, and an intermediate concentration layer distributed in at least a part of a depth range between a lower end of the high concentration layer and a lower end of each of the deep layers.

4 Claims, 24 Drawing Sheets

FIELD EFFECT TRANSISTOR

CROSS REFERENCE TO RELATED APPLICATION

The present application claims the benefit of priority from Japanese Patent Application No. 2023-048629 filed on Mar. 24, 2023. The entire disclosure of the above application is incorporated herein by reference.

TECHNICAL FIELD

The present disclosure relates to a field effect transistor.

BACKGROUND

Conventionally, there has been known a trench-gate field effect transistor including a plurality of trench lower layers of p-type and a plurality of deep layers of p-type.

SUMMARY

A field effect transistor according to an aspect of the present disclosure includes a semiconductor substrate, a gate insulating film, a gate electrode, and a source electrode. The semiconductor substrate has a plurality of trenches provided from an upper surface of the semiconductor substrate. The gate insulating film covers an inner surface of each of the plurality of trenches. The gate electrode is disposed inside each of the plurality of trenches and is insulated from the semiconductor substrate by the gate insulating film. The source electrode is in contact with the upper surface of the semiconductor substrate. The semiconductor substrate includes a source layer of n-type, a body layer of p-type, a plurality of trench lower layers of p-type, a plurality of deep layers of p-type, and a drain-side layer of n-type. The source layer is in contact with the source electrode and in contact with the gate insulating film on a side surface of each of the plurality of trenches. The body layer is in contact with the gate insulating film at a position below the source layer. Each of the plurality of trench lower layers is disposed directly below a corresponding one of the plurality of trenches, extends along a longitudinal direction of the plurality of trenches when the semiconductor substrate is viewed from above, and is electrically connected to the source electrode. Each of the plurality of deep layers is disposed directly below the body layer, extends from a position above a lower end of each of the plurality of trench lower layers to a position below the lower end of each of the plurality of trench lower layers, extends along a first direction intersecting the plurality of trenches when the semiconductor substrate is viewed from above, intersects each of the plurality of trench lower layers, and is electrically connected to the source electrode. Respective deep layers in the plurality of deep layers are arranged at intervals along a second direction orthogonal to the first direction when the semiconductor substrate is viewed from above. The drain-side layer is distributed from a position in contact with a lower surface of the body layer to a position below a lower end of each of the plurality of deep layers through each of the intervals between the deep layers, and is in contact with the gate insulating film at a position below the body layer. The drain-side layer includes a high concentration layer of n-type, an intermediate concentration layer of n-type, and a drift layer of n-type. The intermediate concentration layer is disposed directly below the high concentration layer and has an n-type impurity concentration lower than an n-type impurity concentration of the high concentration layer. The drift layer is disposed directly below the intermediate concentration layer and has an n-type impurity concentration lower than the n-type impurity concentration of the intermediate concentration layer. The high concentration layer is distributed in at least a part of a depth range in which both the plurality of deep layers and the plurality of trench lower layers are present, and is in contact with a side surface of each of the plurality of trench lower layers and a side surface of each of the plurality of deep layers. The intermediate concentration layer is distributed in at least a part of a depth range between a lower end of the high concentration layer and the lower end of each of the plurality of deep layers, and is in contact with the side surface of each of the plurality of deep layers.

BRIEF DESCRIPTION OF DRAWINGS

Objects, features and advantages of the present disclosure will become apparent from the following detailed description made with reference to the accompanying drawings. In the drawings:

FIG. 23 is a diagram for explaining a manufacturing method of the MOSFET according to the second embodiment;

FIG. 26 is a diagram for explaining the manufacturing method of the MOSFET according to the second embodiment.

DETAILED DESCRIPTION

Figure 1:
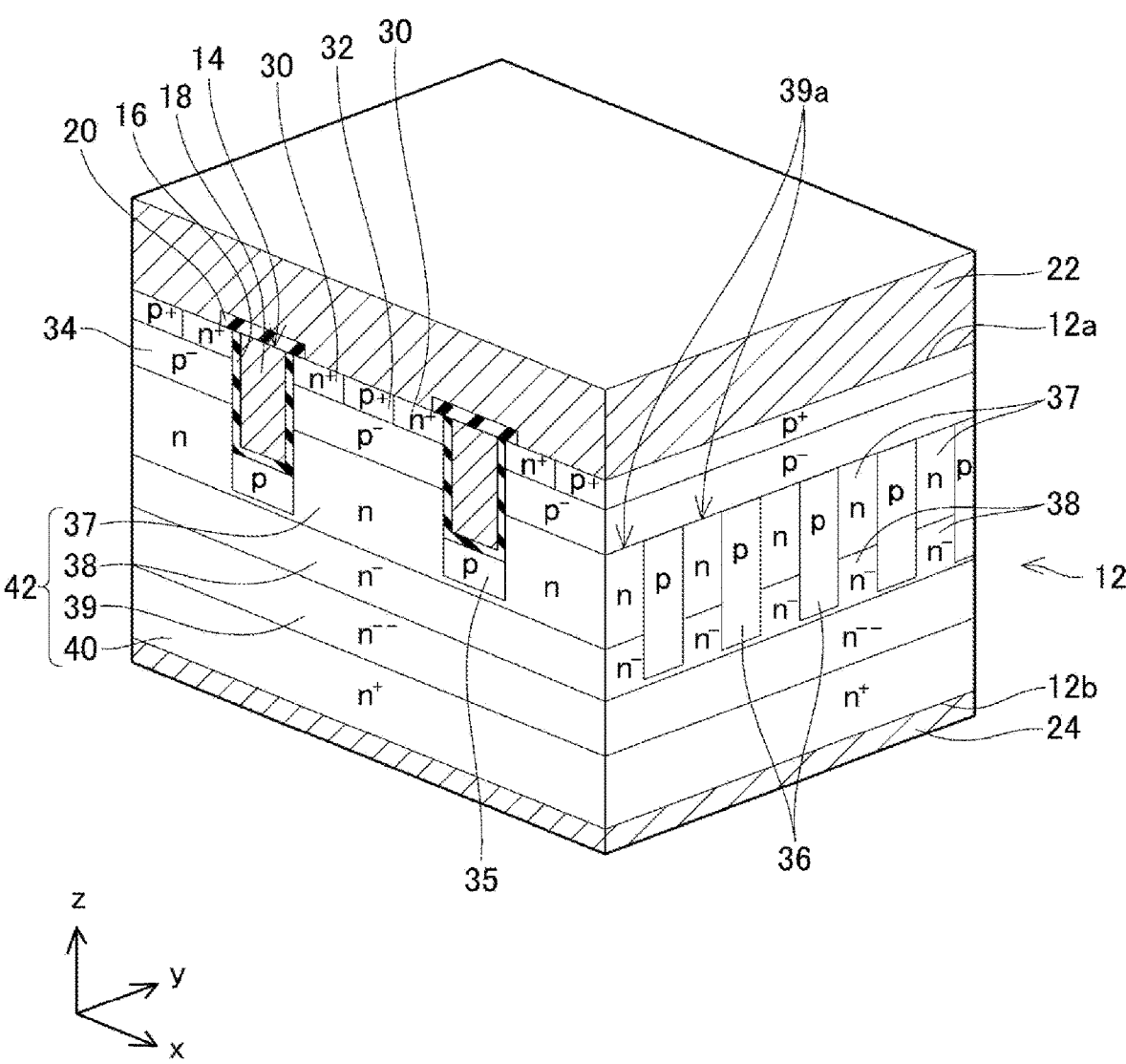
FIG. 1 is a cross-sectional perspective view of a metal-oxide-semiconductor field effect transistor (MOSFET) according to a first embodiment, showing an xz cross section including no p-type deep layer.

Next, a comparative example is described only for understanding the following embodiments. A field effect transistor according to the comparative example includes a plurality of trench lower layers of p-type and a plurality of deep layers of p-type. Each of the trench lower layers is disposed directly below a corresponding trench. Each of the deep layers is disposed directly below a body layer. Each of the deep layers extends so as to intersect the trenches and the trench lower layers when a semiconductor substrate is viewed from above. The deep layers are arranged at intervals in a width direction of the deep layers. An n-type layer is disposed in each of the intervals. A drift layer of n-type is disposed below the trench lower layers and the deep layers. According to this structure, the field effect transistor can have a high breakdown voltage.

In the field effect transistor described above, the n-type layer adjacent to the trench lower layers and the deep layers (that is, the n-type layer disposed between the trench lower layers and the deep layers) serves as a current path. In the on-state of the field effect transistor, a depletion layer extends from the trench lower layers and the deep layers to the n-type layer, thereby narrowing a current path in the n-type layer. Since the current path is narrowed in this portion, there is a limit to the reduction of the on-resistance of the field effect transistor. For example, when the intervals between the trenches (that is, the intervals between the trench lower layers) are narrowed for miniaturization, the width of the n-type layer between the trench lower layers is also narrowed, and the on-resistance is increased.

A field effect transistor according to an aspect of the present disclosure includes a semiconductor substrate, a gate insulating film, a gate electrode, and a source electrode. The semiconductor substrate has a plurality of trenches provided from an upper surface of the semiconductor substrate. The gate insulating film covers an inner surface of each of the plurality of trenches. The gate electrode is disposed inside each of the plurality of trenches and is insulated from the semiconductor substrate by the gate insulating film. The source electrode is in contact with the upper surface of the semiconductor substrate. The semiconductor substrate includes a source layer of n-type, a body layer of p-type, a plurality of trench lower layers of p-type, and a plurality of deep layers of p-type, and a drain-side layer of n-type. The source layer is in contact with the source electrode and in contact with the gate insulating film on a side surface of each of the plurality of trenches. The body layer is in contact with the gate insulating film at a position below the source layer. Each of the plurality of trench lower layers is disposed directly below a corresponding one of the plurality of trenches, extends along a longitudinal direction of the plurality of trenches when the semiconductor substrate is viewed from above, and is electrically connected to the source electrode. Each of the plurality of deep layers is disposed directly below the body layer, extends from a position above a lower end of each of the plurality of trench lower layers to a position below the lower end of each of the plurality of trench lower layers, extends along a first direction intersecting the plurality of trenches when the semiconductor substrate is viewed from above, intersects each of the plurality of trench lower layers, and is electrically connected to the source electrode. Respective deep layers in the plurality of deep layers are arranged at intervals along a second direction orthogonal to the first direction when the semiconductor substrate is viewed from above. The drain-side layer is distributed from a position in contact with a lower surface of the body layer to a position below a lower end of each of the plurality of deep layers through each of the intervals between the deep layers, and is in contact with the gate insulating film at a position below the body layer. The drain-side layer includes a high concentration layer of n-type, an intermediate concentration layer of n-type, and a drift layer of n-type. The intermediate concentration layer is disposed directly below the high concentration layer and has an n-type impurity concentration lower than an n-type impurity concentration of the high concentration layer. The drift layer is disposed directly below the intermediate concentration layer and has an n-type impurity concentration lower than the n-type impurity concentration of the intermediate concentration layer. The high concentration layer is distributed in at least a part of a depth range in which both the plurality of deep layers and the plurality of trench lower layers are present, and is in contact with a side surface of each of the plurality of trench lower layers and a side surface of each of the plurality of deep layers. The intermediate concentration layer is distributed in at least a part of a depth range between a lower end of the high concentration layer and the lower end of each of the plurality of deep layers, and is in contact with the side surface of each of the plurality of deep layers.

In the present specification, the term "directly below" means a position below an object within a range overlapping the object when viewed from above. For example, a trench lower layer disposed directly below a trench is disposed at a position below the trench within a range overlapping the trench when viewed from above. The trench lower layer may be in contact with the trench or may be disposed below the trench with a space between the trench and the trench lower layer. Similarly, a deep layer disposed directly below a body layer is disposed at a position below the body layer within a range overlapping the body layer when viewed from above. The deep layer may be in contact with the body layer or may be disposed below the body layer with a space between the body layer and the deep layer.

The source layer described above may include a plurality of n-type layers.

As long as the high concentration layer is distributed in at least a part of a depth range between an upper end of each of the deep layers and a lower end of each of the trench lower layers, the high concentration layer may be distributed only within the depth range or may be distributed to the outside of the depth range.

As long as the intermediate concentration layer is distributed in at least a part of a depth range between the lower end of the high concentration layer and the lower end of each of the deep layers, the intermediate concentration layer may be distributed only within the depth range or may be distributed to the outside of the depth range.

In this field effect transistor, the lower end of each of the trench lower layers is located above the lower end of each of the deep layers. Therefore, in the depth range below the lower end of each of the trench lower layers, a current path in the drain-side layer located between the deep layers is wide, and the resistance of the current path is low. Furthermore, since the high concentration layer is disposed in the drain-side layer within the depth range where both the deep layers and the trench lower layers are present, the resistance of the current path in the drain-side layer is low even within this depth range. As described above, in the intervals between the trench lower layers and the p-type deep layers, the resistance of the current path in the drain-side layer is low in any depth range. Accordingly, the on-resistance of the field effect transistor is reduced. In addition, since the lower end of each of the deep layers is located below the lower end of each of the trench lower layers, an electric field is likely to concentrate around the lower end of each of the deep layers. However, since the intermediate concentration layer having a relatively low n-type impurity concentration is disposed at a position adjacent to the deep layers, electric field concentration around the lower end of each of the deep layers is restricted. The electric field to the gate insulating film disposed at the lower end of each of the trenches is relaxed by each of the trench lower layers. Although it is difficult for a depletion layer to extend to the high concentration layer around the lower trench layers, since the deep layers extend to positions below the lower end of each of the lower trench layers, it is difficult for a high electric field to be generated at the lower end of each of the trenches. Therefore, even if it is difficult for the depletion layer to extend from the trench lower layers to the high concentration layer, the electric field to the gate insulating film disposed at the lower end of each of the trenches can be sufficiently restricted. Therefore, according to the structure of this field effect transistor, it is possible to realize an on-resistance lower than that of the comparative example while securing a sufficient breakdown voltage.

In one example of the field effect transistor, the high concentration layer may include a first layer having an n-type impurity concentration higher than that of the intermediate concentration layer and a second layer having an n-type impurity concentration higher than that of the first layer. The second layer may be disposed above the lower end of each of the trenches. The first layer may be disposed between a lower end of the second layer and an upper end of the intermediate concentration layer.

According to this configuration, the on-resistance can be further reduced while ensuring a high breakdown voltage.

In one example of the field effect transistor, a p-type impurity concentration of each of the trench lower layers may be higher than a p-type impurity concentration of each of the deep layers.

According to this configuration, a feedback capacitance of the field effect transistor can be reduced.

In one example of the field effect transistor, the p-type impurity concentration of the deep layers may be set so that a non-depleted region remain in each of the deep layers in a state where a saturation current is flowing through the field effect transistor.

According to this configuration, the drain-side layer is more easily depleted. Therefore, the current path is easily blocked when the load is short-circuited, and the saturation current can be reduced.

First Embodiment

Figure 2:
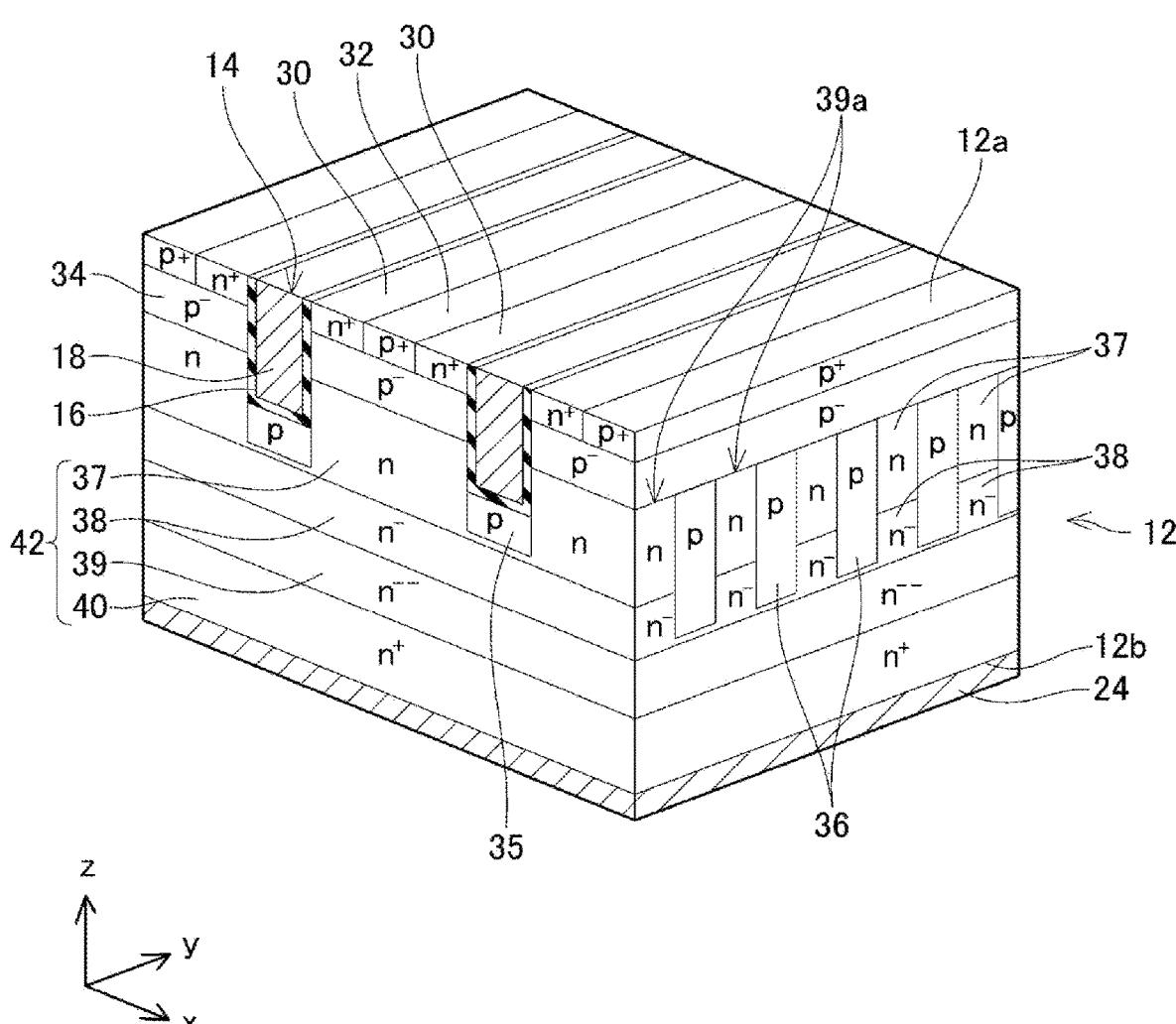
FIG. 2 is a cross-sectional perspective view of the MOSFET according to the first embodiment, omitting a source electrode and an interlayer insulating films and showing the xz cross section including no p-type deep layer.
Figure 3:
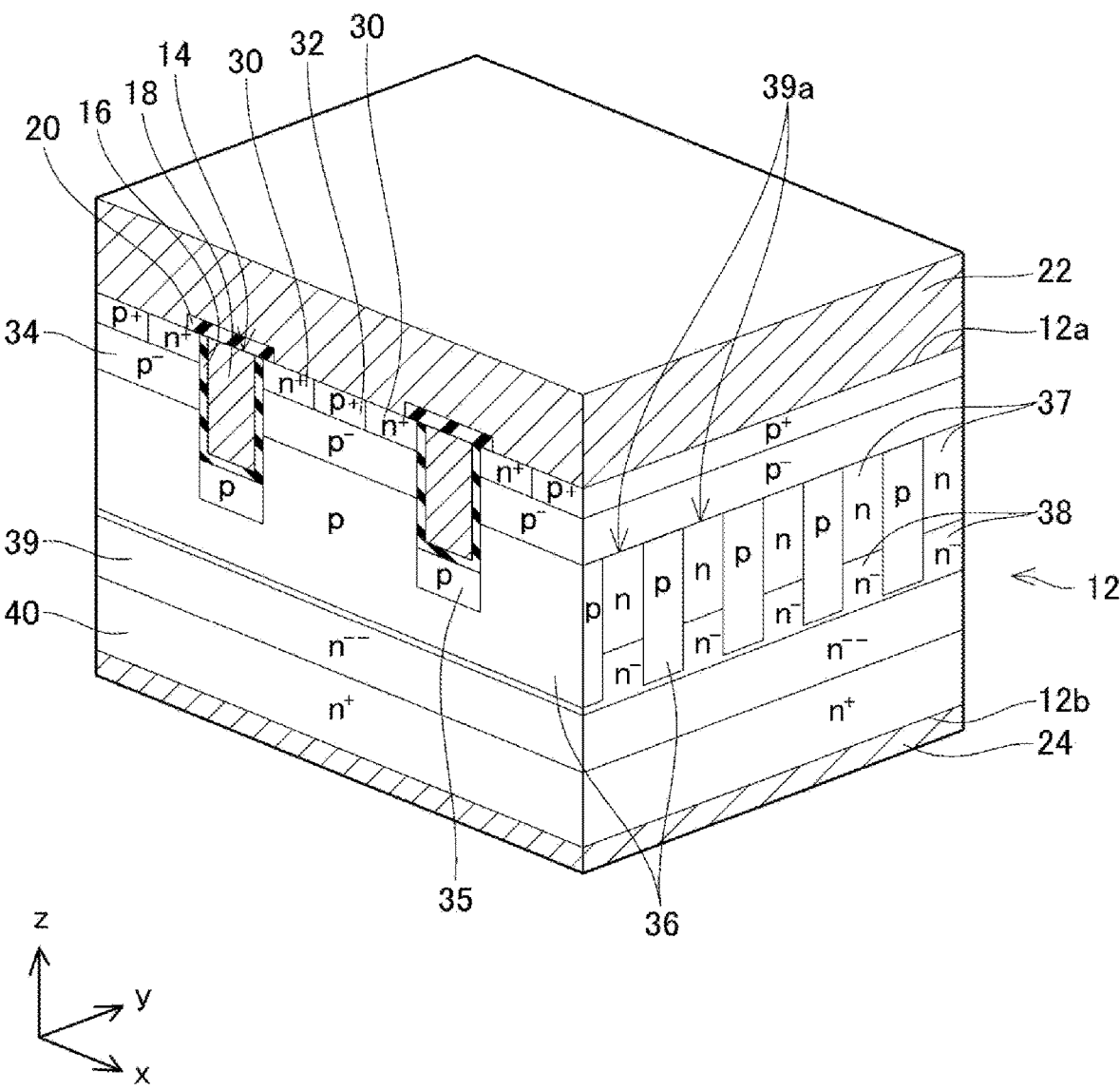
FIG. 3 is a cross-sectional perspective view of the MOSFET according to the first embodiment, showing an xz cross section including p-type deep layers.

A metal-oxide-semiconductor field effect transistor (MOSFET) of a first embodiment shown in FIGS. 1 to 3 has a semiconductor substrate 12. In the following, a direction parallel to an upper surface 12a of the semiconductor substrate 12 is also referred to as an x direction, a thickness direction of the semiconductor substrate 12 is also referred to as a z direction, and a direction perpendicular to the x direction and the z direction is also referred to as a y direction. The semiconductor substrate 12 is made of silicon carbide (SiC). However, the semiconductor substrate 12 may also be made of other material such as silicon or gallium nitride. A plurality of trenches 14 is provided from the upper surface 12a of the semiconductor substrate 12. As shown in FIG. 2, the trenches 14 extend in the y direction on the upper surface 12a. The trenches 14 are arranged at intervals in the x direction.

As shown in FIGS. 1 to 3, an inner surface (that is, a bottom surface and a side surface) of each of the trenches 14 is covered with a gate insulating film 16. A gate electrode 18 is disposed in each of the trenches 14. The gate electrode 18 is insulated from the semiconductor substrate 12 by the gate insulating film 16. An upper surface of each of the gate electrodes 18 is covered with an interlayer insulating film 20. A source electrode 22 is disposed on the semiconductor substrate 12. The source electrode 22 covers each of the interlayer insulating films 20. The source electrode 22 is insulated from the gate electrodes 18 by the interlayer insulating films 20. The source electrode 22 is in contact with the upper surface 12a of the semiconductor substrate 12 at portions where the interlayer insulating films 20 are not provided. A drain electrode 24 is disposed at a position directly below the semiconductor substrate 12. The drain electrode 24 is in contact with the entire region of a lower surface 12b of the semiconductor substrate 12.

The semiconductor substrate 12 includes a plurality of source layers 30, a plurality of contact layers 32, a body layer 34, a plurality of trench lower layers 35, a plurality of p-type deep layers 36, and a drain-side n-type layer 42.

Each of the source layers 30 is an n-type layer having a high n-type impurity concentration. Each of the source layers 30 is disposed in a range partially including the upper surface 12a of the semiconductor substrate 12. Each of the source layers 30 is in ohmic contact with the source electrode 22. Each of the source layers 30 is in contact with the gate insulating film 16 at an uppermost portion of the side surface of the trench 14. Each of the source layers 30 faces the gate electrode 18 with the gate insulating film 16 interposed therebetween. Each of the source layers 30 extends in the y direction along the side surfaces of the trenches 14.

Each of the contact layers 32 is a p-type layer having a high p-type impurity concentration. Each of the contact layers 32 is disposed in a range partially including the upper surface 12a of the semiconductor substrate 12. Each of the contact layers 32 is disposed between two adjacent source layers 30. Each of the contact layers 32 is in ohmic contact with the source electrode 22. Each of the contact layers 32 extends in the y direction.

The body layer 34 is a p-type layer having a lower p-type impurity concentration than the contact layers 32. The body layer 34 is disposed at a position below the source layers 30 and the contact layers 32. The body layer 34 is in contact with the source layers 30 and the contact layers 32 from below. The body layer 34 is in contact with the gate insulating films 16 on the side surfaces of the trenches 14 located below the source layers 30. The body layer 34 faces the gate electrode 18 with the gate insulating film 16 interposed therebetween.

Figure 5:
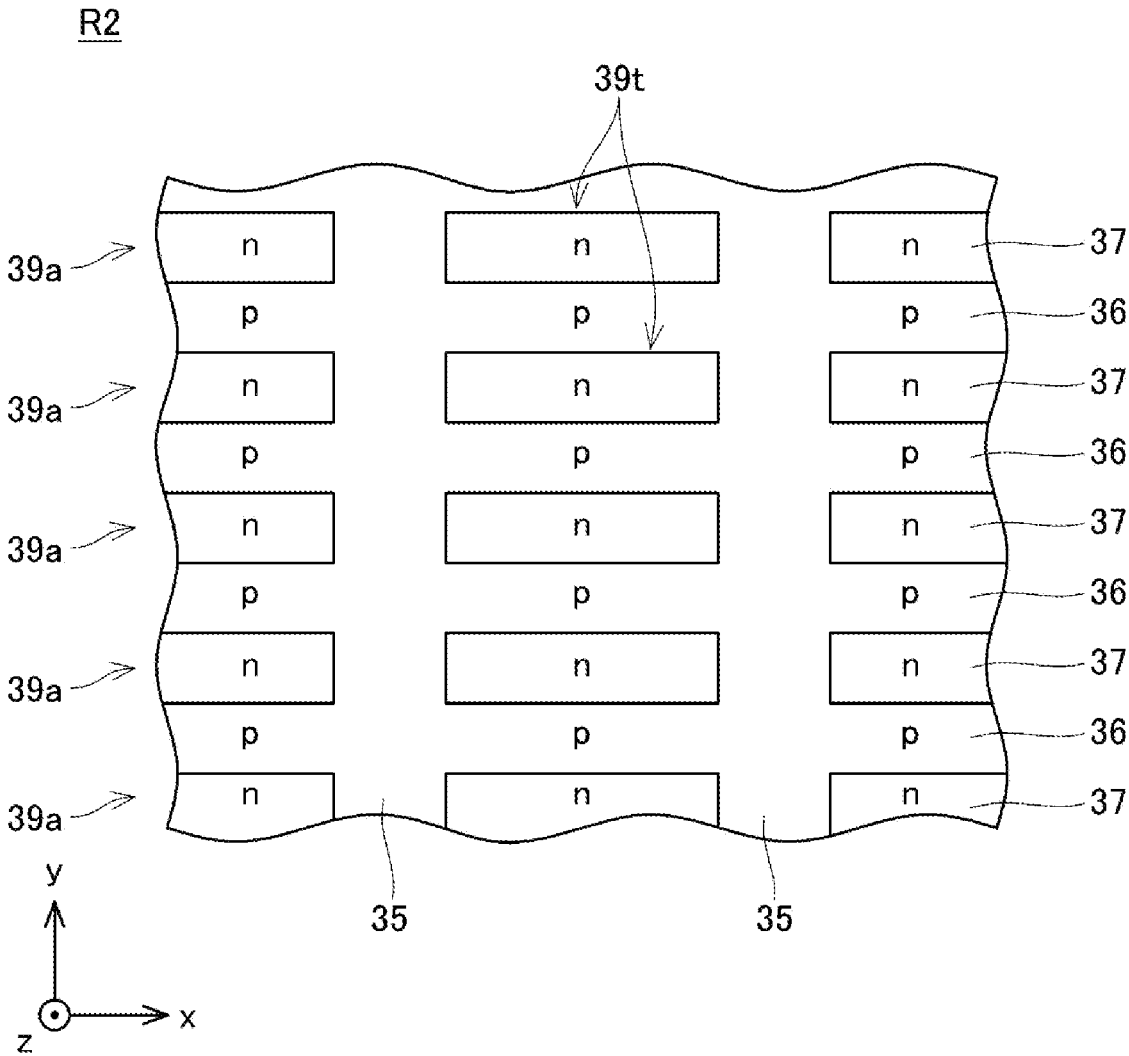
FIG. 5 is a cross-sectional view showing an xy cross section at a position including trench lower layers, the p-type deep layers, and the high concentration layer.

Each of the trench lower layers 35 is a p-type layer disposed at a position directly below a corresponding one of the trenches 14. In this example, each of the trench lower layers 35 is disposed at a position in contact with the bottom surface of the corresponding trench 14. That is, each of the trench lower layers 35 is in contact with the gate insulating film 16 at the bottom surface of the corresponding one of the trenches 14. As shown in FIG. 5, when the semiconductor substrate 12 is viewed from above, each of the trench lower layers 35 extends long along the y direction. That is, each of the trench lower layers 35 extends long in the y direction along the bottom surface of the corresponding one of the trenches 14. A p-type impurity concentration of each of the trench lower layers 35 is higher than a p-type impurity concentration of the body layer 34 and lower than a p-type impurity concentration of the contact layers 32. The p-type impurity concentration of each of the trench lower layers 35 is higher than a p-type impurity concentration of each of the p-type deep layers 36.

Figure 4:
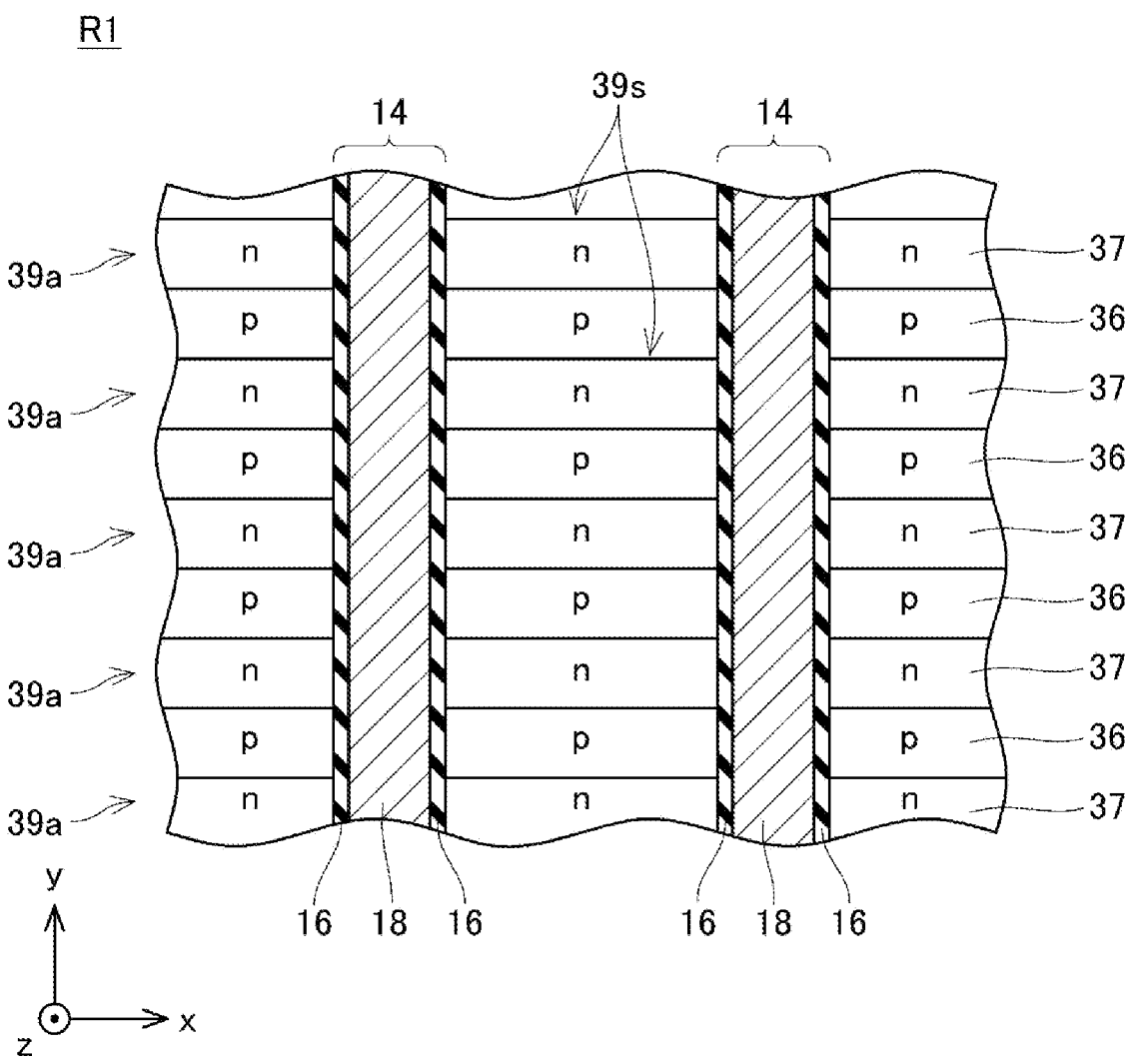
FIG. 4 is a cross-sectional view showing an xy cross section at a position including trenches, p-type deep layers, and a high concentration layer.
Figure 6:
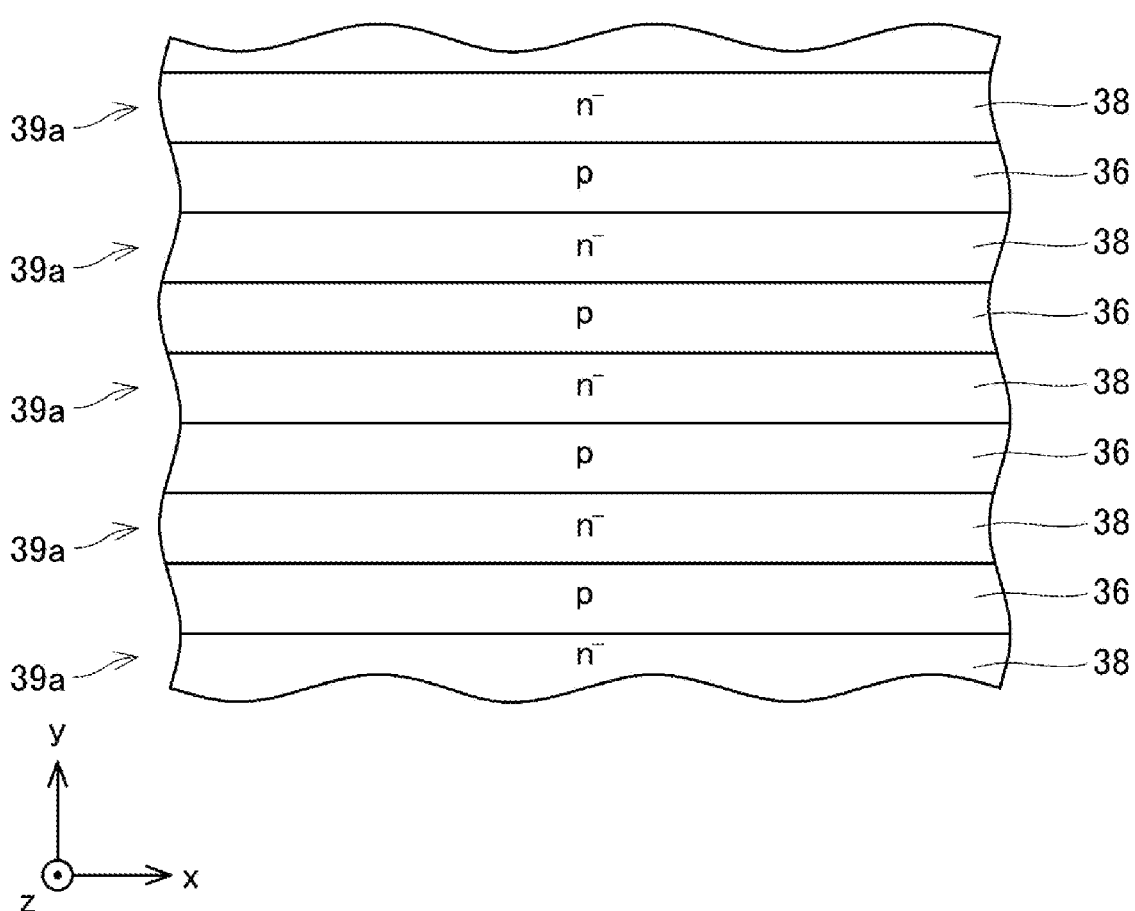
FIG. 6 is a cross-sectional view showing an xy cross section at a position below the trenches and including the p-type deep layers and an intermediate concentration layer.

As shown in FIGS. 1 to 3, each of the p-type deep layers 36 is a p-type layer protruding downward from a lower surface of the body layer 34. The p-type deep layers 36 are arranged at intervals in the y direction. Each of the p-type deep layers 36 has a shape elongated in the z direction in the yz cross section. That is, a dimension of each of the p-type deep layers 36 in the z direction is larger than a dimension of each of the p-type deep layers 36 in the y direction. Each of the p-type deep layers 36 extends from the lower surface of the body layer 34 to a depth below a lower end of each of the trench lower layers 35. As shown in FIGS. 4 to 6, when the semiconductor substrate 12 is viewed from above, each of the p-type deep layers 36 extends long in the x direction. As shown in FIG. 4, when the semiconductor substrate 12 is viewed from above, the p-type deep layers 36 intersect the trenches 14. Each of the p-type deep layers 36 is in contact with the gate insulating film 16 on the side surface of each of the trenches 14 located below the body layer 34. As shown in FIG. 5, when the semiconductor substrate 12 is viewed from above, the p-type deep layers 36 intersect the trench lower layers 35. Each of the p-type deep layers 36 is connected to the trench lower layers 35 at intersections with the trench lower layers 35. The p-type impurity concentration of each of the p-type deep layers 36 is higher than the p-type impurity concentration of the body layer 34 and lower than the p-type impurity concentration of the contact layer 32. In the present embodiment, the x direction corresponds to a first direction, and the y direction corresponds to a second direction.

Each of the p-type deep layers 36 is in contact with the body layer 34 from below. Therefore, each of the p-type deep layers 36 is electrically connected to the source electrode 22 via the body layer 34 and the contact layers 32. As described above, the trench lower layers 35 are connected to the p-type deep layers 36 at the intersections between the trench lower layers 35 and the p-type deep layers 36. Therefore, each of the trench lower layers 35 is electrically connected to the source electrode 22 via the p-type deep layers 36, the body layer 34, and the contact layers 32.

FIG. 4 shows a cross section along the xy plane in a depth range R1 in which both the trenches 14 and the p-type deep layers 36 are present. FIG. 5 shows a cross section along the xy plane in a depth range R2 in which both the trench lower layers 35 and the p-type deep layers 36 are present. FIG. 6 shows a cross section along the xy plane in a depth range R3 below the lower ends of the trench lower layers 35 and above the lower ends of the p-type deep layers 36. As shown in FIGS. 4 to 6, in the depth ranges R1, R2, and R3, the p-type deep layers 36 are arranged at intervals in the y direction. Hereinafter, a portion between the p-type deep layers 36 is referred to as a spacing portion 39*a*. As shown in FIG. 4, in the depth range R1, the trenches 14 and the p-type deep layers 36 extend in a lattice shape. Therefore, a plurality of rectangular regions 39*s* defined by the trenches 14 and the p-type deep layers 36 are formed in each of the spacing portions 39*a*. As shown in FIG. 5, in the depth range R2, the trench lower layers 35 and the p-type deep layers 36 extend in a lattice shape. Therefore, a plurality of rectangular regions 39*t* partitioned by the trench lower layers 35 and the p-type deep layers 36 are formed in each of the spacing portions 39*a*.

As shown in FIG. 1 and FIG. 2, the drain-side n-type layer 42 is an n-type layer in contact with the drain electrode 24. The drain-side n-type layer 42 is distributed from a position in contact with the lower surface of the body layer 34 to the lower surface 12*b* of the semiconductor substrate 12 through the spacing portions 39*a*. The drain-side n-type layer 42 is in contact with the gate insulating film 16 on the side surface of each of the trenches 14 at positions below the body layer 34. The drain-side n-type layer 42 includes a high concentration layer 37, an intermediate concentration layer 38, a drift layer 39, and a drain layer 40. An n-type impurity concentration of the intermediate concentration layer 38 is higher than an n-type impurity concentration of the drift layer 39. An n-type impurity concentration of the high concentration layer 37 is higher than the n-type impurity concentration of the intermediate concentration layer 38. An n-type impurity concentration of the drain layer 40 is higher than the n-type impurity concentration of the high concentration layer 37.

The high concentration layer 37 is disposed at a position directly below the body layer 34. The high concentration layer 37 is distributed in a depth range from the lower end of the body layer 34 to a position below the lower end of each of the trench lower layers 35. Thus, as shown in FIG. 4 and FIG. 5, the high concentration layer 37 is distributed in the depth range R1 and the depth range R2. As shown in FIGS. 1 to 3, the high concentration layer 37 is disposed in each of the spacing portions 39*a*. The high concentration layer 37 is in contact with the lower surface of the body layer 34. As shown in FIG. 4, in the depth range R1, the high concentration layer 37 is disposed in the rectangular regions 39*s*. The high concentration layer 37 is in contact with the gate insulating film 16 on the side surface of each of the trenches 14. As shown in FIG. 5, in the depth range R2, the high concentration layer 37 is disposed in the rectangular regions 39*t*. The high concentration layer 37 is in contact with the side surface of each of the trench lower layers 35. As shown in FIG. 4 and FIG. 5, in the depth ranges R1 and R2, the high concentration layer 37 is in contact with the side surface of each of the p-type deep layers 36. As shown in FIG. 1, the high concentration layer 37 is in contact with the lower surface of each of the trench lower layers 35.

As shown in FIGS. 1 to 3, the intermediate concentration layer 38 is disposed at a position directly below the high concentration layer 37. The intermediate concentration layer 38 is distributed in a depth range from the lower end of the high concentration layer 37 to a position below the lower end of each of the p-type deep layers 36. Therefore, as shown in FIG. 6, the intermediate concentration layer 38 is distributed within the depth range R3. As shown in FIG. 1 and FIG. 6, the intermediate concentration layer 38 is disposed in each of the spacing portions 39a. The intermediate concentration layer 38 is in contact with the lower surface of the high concentration layer 37. The intermediate concentration layer 38 is in contact with the side surface and the lower surface of each of the p-type deep layers 36.

The drift layer 39 is disposed at a position directly below the intermediate concentration layer 38. The drift layer 39 is distributed over a range directly below the plurality of p-type deep layers 36 and the plurality of spacing portions 39a. The drift layer 39 is in contact with a lower surface of the intermediate concentration layer 38.

The drain layer 40 is disposed at a position directly below the drift layer 39. The drain layer 40 is distributed in a depth range from the lower end of the drift layer 39 to the lower surface 12b of the semiconductor substrate 12. The drain layer 40 is in contact with a lower surface of the drift layer 39. The drain layer 40 is in ohmic contact with the drain electrode 24.

Next, the operation of the MOSFET of the first embodiment will be described. Normally, the MOSFET is used in a state where a potential higher than a potential of the source electrode 22 is applied to the drain electrode 24. When a potential equal to or higher than a gate threshold value is applied to each of the gate electrodes 18, a channel is formed in the body layer 34 in the vicinity of the gate insulating film 16. The source layers 30 and the high concentration layer 37 are connected by the channel. Therefore, electrons flow from the source layers 30 to the drain layer 40 through the channel, the high concentration layer 37, the intermediate concentration layer 38, and the drift layer 39. That is, the MOSFET is turned on. When the potential of each of the gate electrodes 18 is reduced from a value equal to or higher than the gate threshold value to a value less than the gate threshold value, the channel disappears and the flow of electrons stops. In other words, the MOSFET is turned off.

Next, the operation when the MOSFET is turned on will be described in more detail. As described above, when the MOSFET is turned on, electrons flow from the source layers 30 to the drain layer 40 through the channel, the high concentration layer 37, the intermediate concentration layer 38, and the drift layer 39. Therefore, the high concentration layer 37 and the intermediate concentration layer 38 constitute a part of the current path. In the on-state of the MOSFET, a depletion layer having a predetermined width extends from the p-type deep layers 36 and the trench lower layers 35 to the high concentration layer 37 and the intermediate concentration layer 38 due to a built-in potential. The depletion layer narrows the current path inside the high concentration layer 37 and the intermediate concentration layer 38.

As shown in FIG. 4 and FIG. 5, in the depth ranges R1 and R2, each of the spacing portions 39a is divided into the plurality of rectangular regions 39s and 39t by the trenches 14 and the trench lower layers 35. Therefore, the area of the high concentration layer 37 is small in the xy cross section shown in FIG. 4 and FIG. 5. When the depletion layer widely extends from the p-type deep layers 36 and the trench lower layers 35 to the high concentration layer 37, the current path in the high concentration layer 37 becomes extremely narrow. However, since the n-type impurity concentration of the high concentration layer 37 is high, the extension of the depletion layer from the p-type deep layers 36 and the trench lower layers 35 to the high concentration layer 37 is restricted. Therefore, a wide current path can be secured in the high concentration layer 37. In addition, since the n-type impurity concentration of the high concentration layer 37 is high, the resistivity of the current path in the depth ranges R1 and R2 is reduced. Therefore, the resistance of the current path in the depth ranges R1 and R2 is reduced.

On the other hand, since the intermediate concentration layer 38 has the n-type impurity concentration lower than the n-type impurity concentration of the high concentration layer 37, the depletion layer extends relatively widely from the p-type deep layers 36 and the trench lower layers 35 to the intermediate concentration layer 38. The depletion layer narrows the current path in the intermediate concentration layer 38. However, as shown in FIG. 6, the trenches 14 and the trench lower layers 35 are not present in the depth range R3. Therefore, the intermediate concentration layer 38 in the depth range R3 has a larger area in the xy cross section than the high concentration layer 37 in the depth ranges R1 and R2. Therefore, even if the current path in the intermediate concentration layer 38 is narrowed by the depletion layer, a wide current path can be secured in the intermediate concentration layer 38. In addition, since the intermediate concentration layer 38 having the n-type impurity concentration higher than the n-type impurity concentration of the drift layer 39 is disposed in the depth range R3, the resistivity of the current path in the depth range R3 is reduced. Therefore, the resistance of the current path in the depth range R3 is reduced.

As described above, according to the first embodiment, the resistance of the current path in the spacing portions 39a can be reduced. Therefore, the on-resistance of the MOSFET of the first embodiment is low.

Next, the operation when the MOSFET is turned off will be described in more detail. When the channel disappears, a reverse voltage is applied to a pn junction at an interface between the body layer 34 and the drain-side n-type layer 42. Therefore, a depletion layer spreads from the body layer 34 to the drain-side n-type layer 42. Each of the p-type deep layers 36 is electrically connected to the source electrode 22 and has substantially the same potential as the body layer 34. Therefore, when the channel disappears, a reverse voltage is also applied to a pn junction at an interface between each of the p-type deep layers 36 and the drain-side n-type layer 42. Therefore, a depletion layer also spreads from each of the p-type deep layers 36 to the drain-side n-type layer 42. Furthermore, each of the trench lower layers 35 is electrically connected to the source electrode 22 and has substantially the same potential as the body layer 34. Therefore, when the channel disappears, a reverse voltage is also applied to a pn junction at an interface between each of the trench lower layers 35 and the drain-side n-type layer 42. Therefore, a depletion layer also spreads from each of the trench lower layers 35 to the drain-side n-type layer 42. Thus, the depletion layers extend from the body layer 34, the p-type deep layers 36, and the trench lower layers 35 to the drain-side n-type layer 42. Substantially all of the high concentration layer 37, the intermediate concentration layer 38, and the drift layer 39 are depleted. The drain layer 40 is hardly depleted. The high voltage applied between the drain electrode 24 and the source electrode 22 is held by the high concentration layer 37, the intermediate concentration layer 38, and the drift layer 39 that are depleted. The p-type impurity concentrations of the trench lower layers 35 and the p-type deep layers 36 are set such that a non-depleted region remains in the trench lower layers 35 and the p-type deep layers 36 when the MOSFET is in the off-state. Thereby, the extension of the depletion layers to the high concentration layer 37, the intermediate concentration layer 38, and the drift layer 39 is promoted.

Since each of the p-type deep layers 36 protrudes downward (that is, toward the drift layer 39) below the trench lower layer 35, an electric field is likely to concentrate around the lower end of each of the p-type deep layers 36. However, since the n-type impurity concentration of the intermediate concentration layer 38 adjacent to the p-type deep layers 36 is not so high, the periphery of the lower end of each of the p-type deep layers 36 is depleted relatively quickly when the MOSFET is turned off. Accordingly, an electric field concentration around the lower end of each of the p-type deep layers 36 can be restricted.

Since each of the trench lower layers 35 is in contact with the high concentration layer 37, the depletion layer is less likely to extend around each of the trench lower layers 35 when the MOSFET is turned off. That is, when the MOSFET is turned off, the speed at which the depletion layer extends around each of the trench lower layers 35 is slow. If the extension of the depletion layer is insufficient in the periphery of each of the trench lower layers 35, a high electric field is applied to the gate insulating film 16 covering the lower end portion of each of the trenches 14, and the insulating property of the gate insulating film 16 deteriorates. However, in the present embodiment, since the p-type deep layers 36 protrude downward below the trench lower layers 35, a high electric field is unlikely to be generated in a region above the lower end of each of the p-type deep layers 36. Therefore, even if the extension of the depletion layer is slow around each of the trench lower layers 35, the electric field applied to the gate insulating film 16 can be sufficiently restricted.

As described above, according to the first embodiment, it is possible to restrict the generation of a high electric field at the lower end of each of the p-type deep layers 36 and the lower end of each of the trenches 14. Therefore, the MOSFET of the first embodiment has a high breakdown voltage.

Figure 7:
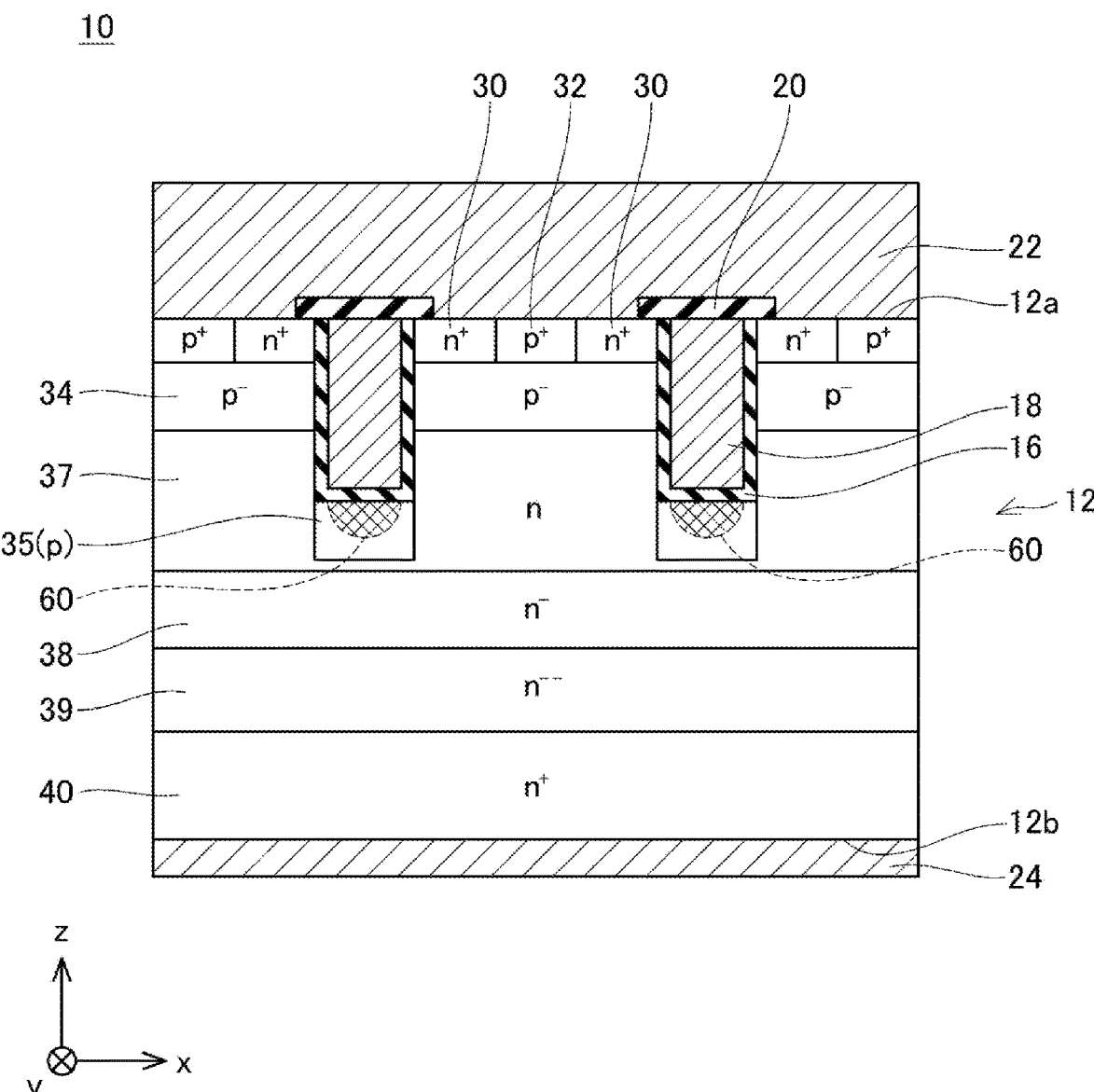
FIG. 7 is a cross-sectional view showing the distribution of non-depleted regions in the trench lower layers in an off-state in an xz cross section.

FIG. 7 shows the state of the trench lower layers 35 when the MOSFET is off. As described above, the p-type impurity concentration of the trench lower layers 35 is higher than the p-type impurity concentration of the p-type deep layers 36. Therefore, as shown in FIG. 7, in a state where the MOSFET is off, a relatively large non-depleted region 60 remains in a range in contact with the bottom surface of the corresponding trench 14 in each of the trench lower layers 35. Since the non-depleted region 60 remains at the position directly below each of the trenches 14, the feedback capacitance (that is, the electrostatic capacitance between the gate electrode 18 and the drain electrode 24) is reduced. Therefore, the MOSFET of the present embodiment can be switched at high speed. In addition, since the non-depleted region 60 remains at the position directly below each of the trenches 14, the electric field applied to the gate insulating film 16 can be reduced by the shielding effect.

Figure 8:
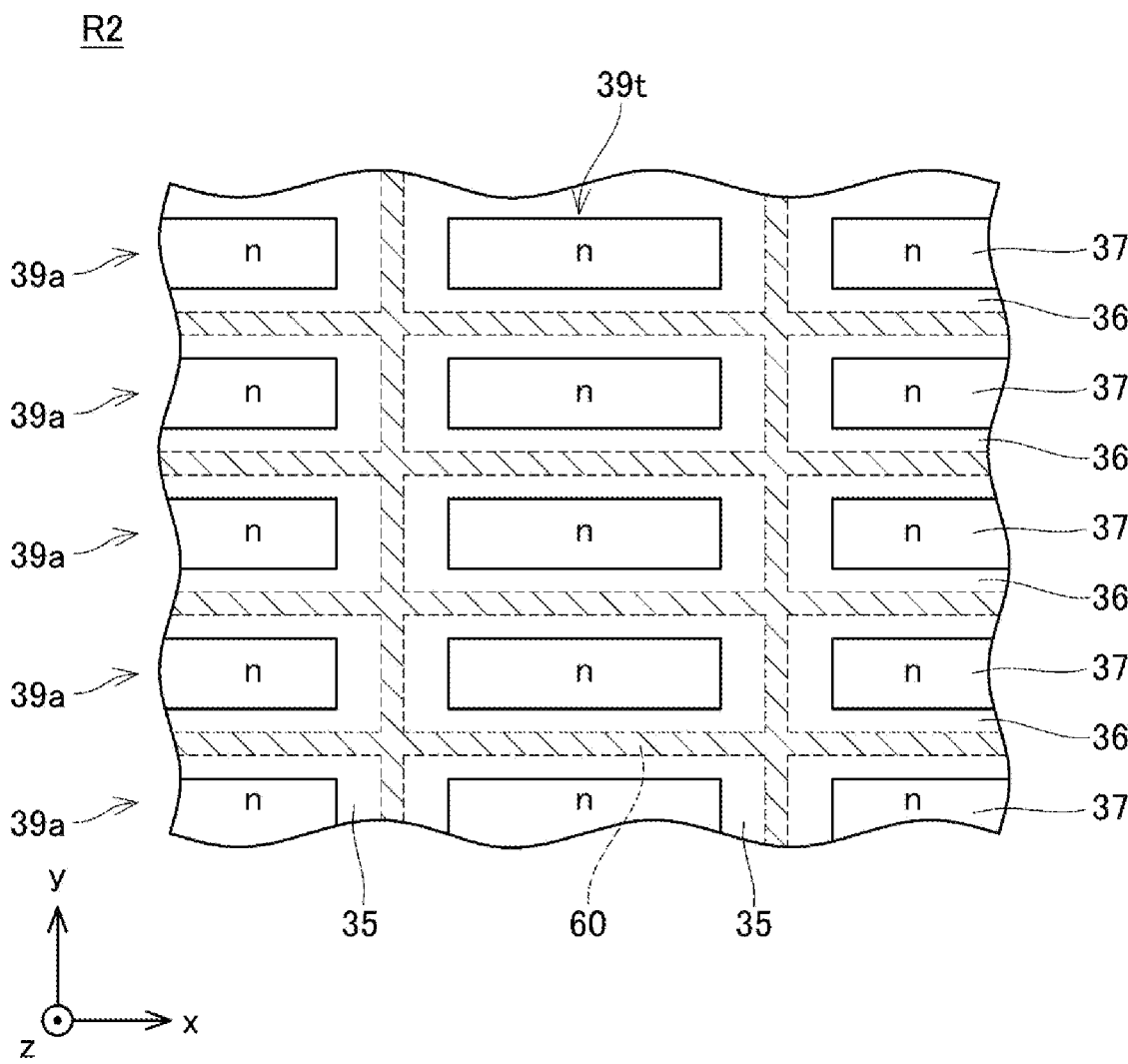
FIG. 8 is a cross-sectional view showing the distribution of non-depleted regions in the trench lower layers and the p-type deep layers in a short-circuit state in an xy cross section.

Next, the operation when a load connected to the MOSFET is short-circuited in the on-state of the MOSFET of the first embodiment will be described. When the load is short-circuited, the potential of the drain electrode 24 becomes extremely higher than the potential of the source electrode 22, and a large current flows through the MOSFET. In addition, when the load is short-circuited, a high reverse voltage is applied to a pn junction at an interface between the drain-side n-type layer 42 and each p-type layer including the body layer 34, the p-type deep layers 36, and the trench lower layers 35. Therefore, a depletion layer extends from the p-type layers to the drain-side n-type layer 42. FIG. 8 shows a state of the p-type deep layers 36 and the trench lower layers 35 when the load is short-circuited. As shown in FIG. 8, when the load is short-circuited, the non-depleted region 60 remains in the central portions of the p-type deep layers 36 and the trench lower layers 35. This promotes the extension of the depletion layers from the p-type deep layers 36 and the trench lower layers 35 to the high concentration layer 37 and the intermediate concentration layer 38. Therefore, the high concentration layer 37 and the intermediate concentration layer 38 are instantaneously depleted when the load is short-circuited. Therefore, the current flowing through the MOSFET when the load is short-circuited (so-called saturation current) is reduced. In this way, since the p-type impurity concentrations of the p-type deep layers 36 and the trench lower layers 35 are set to high concentrations to the extent that the non-depleted regions 60 remain in the p-type deep layers 36 and the trench lower layers 35 when the load is short-circuited, the saturation current can be restricted.

Figure 9:
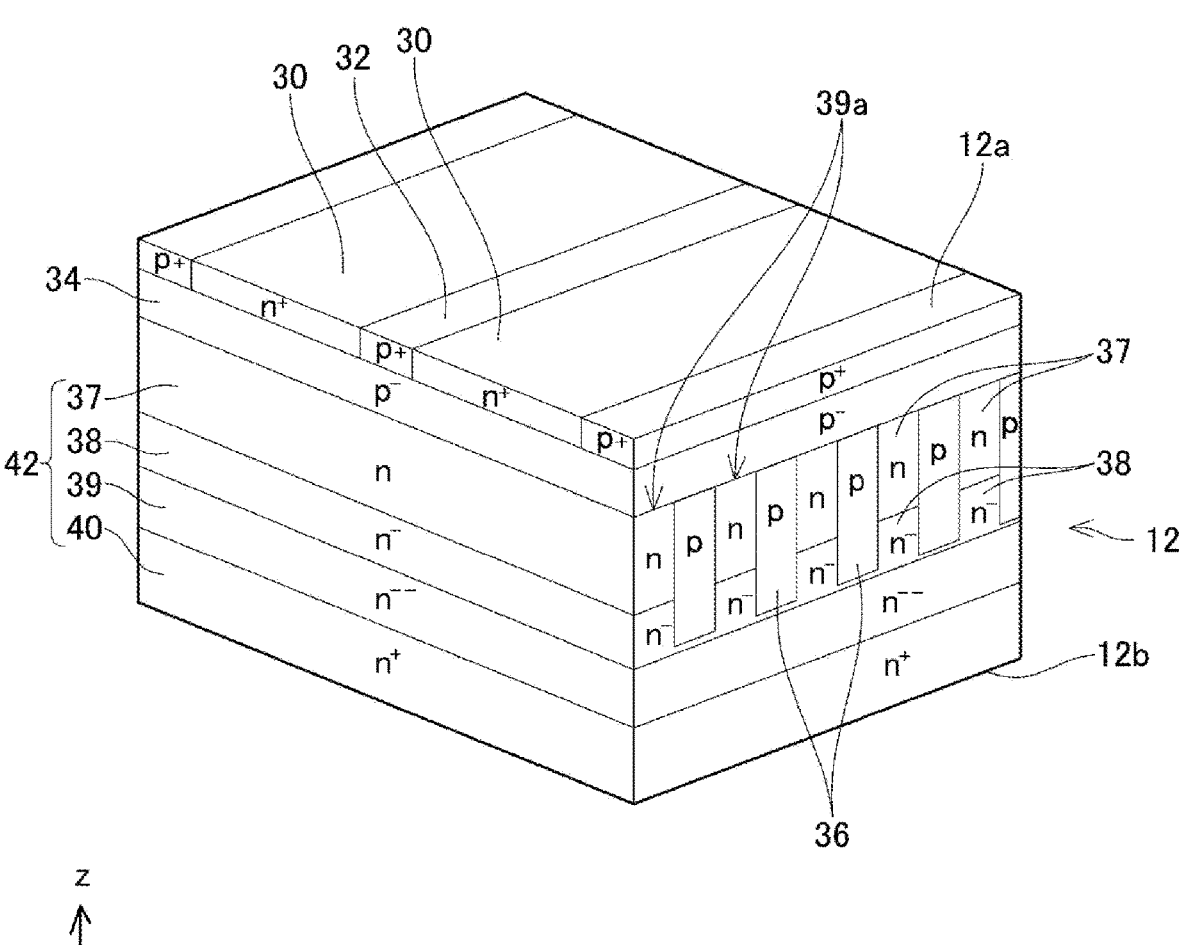
FIG. 9 is a diagram for explaining a manufacturing method of the MOSFET according to the first embodiment.
Figure 10:
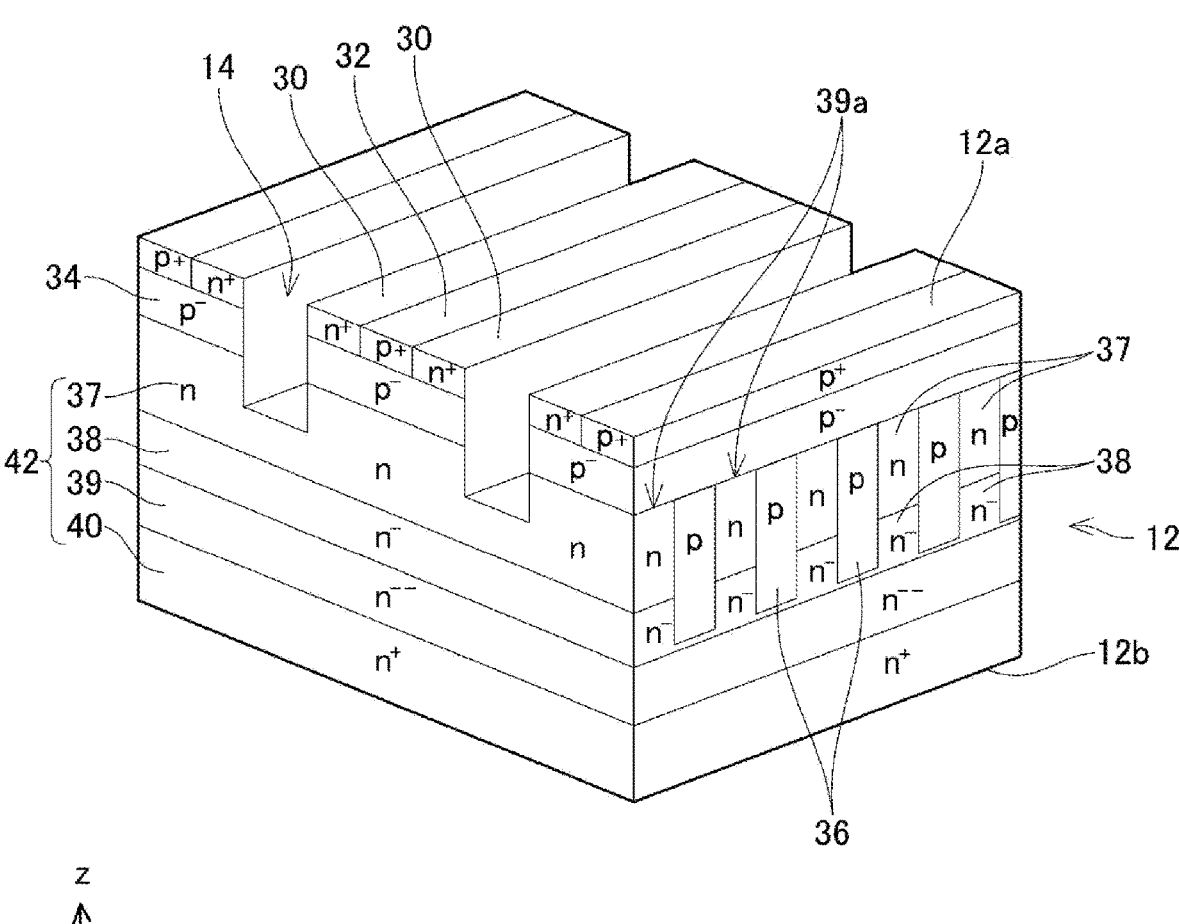
FIG. 10 is a diagram for explaining the manufacturing method of the MOSFET according to the first embodiment.
Figure 11:
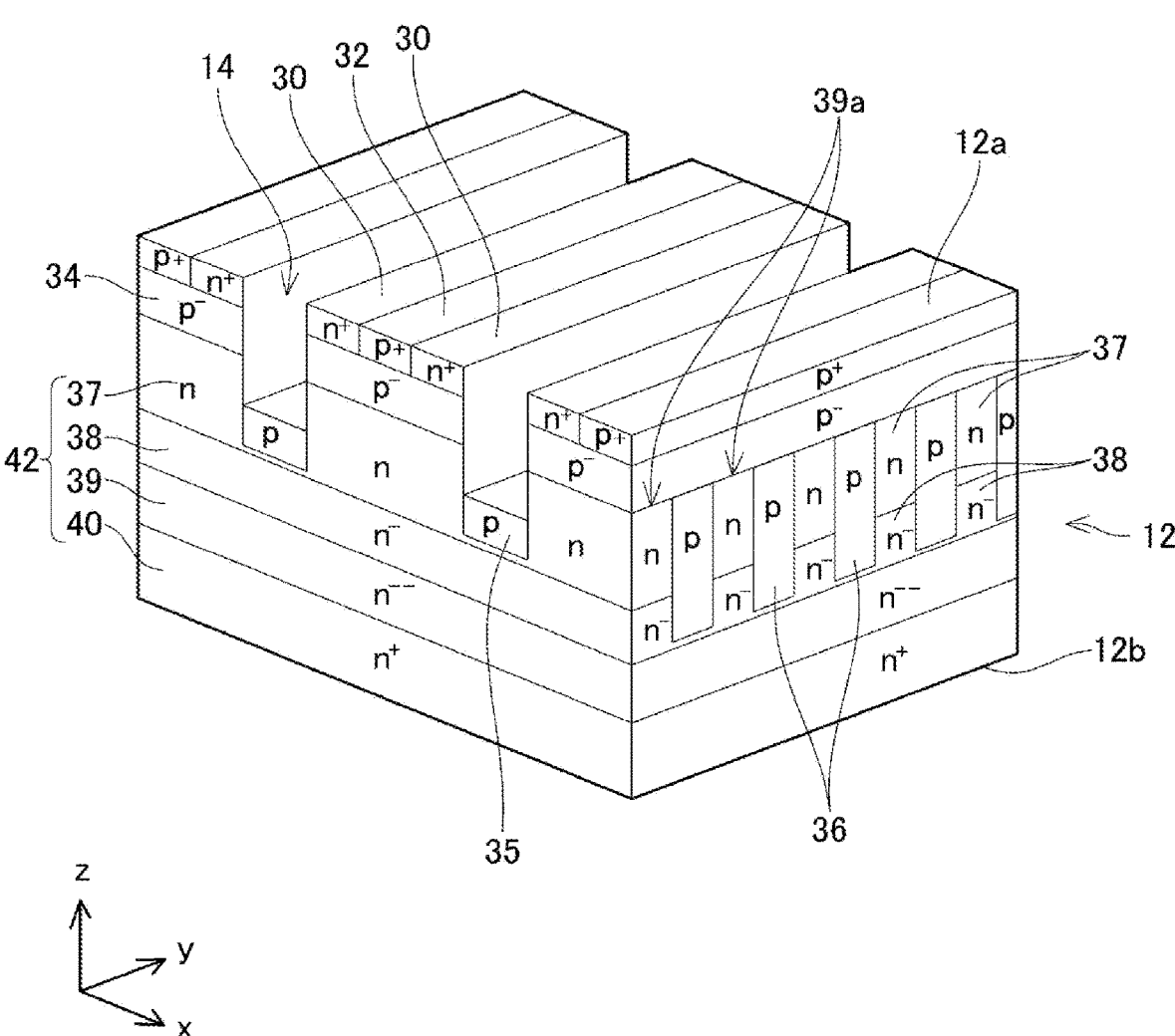
FIG. 11 is a diagram for explaining the manufacturing method of the MOSFET according to the first embodiment.

The following describes a method of manufacturing the MOSFET according to the first embodiment. First, as shown in FIG. 9, the intermediate concentration layer 38, the high concentration layer 37, the p-type deep layers 36, the body layer 34, the source layers 30, and the contact layers 32 are formed by ion implantation into the drift layer 39. The p-type deep layers 36 are formed by implanting p-type impurities deeply into the upper surface 12a. Next, as shown in FIG. 10, the trenches 14 are formed by etching the upper surface 12a of the semiconductor substrate 12. Next, as shown in FIG. 11, p-type impurity ions are implanted into the bottom surfaces of the trenches 14 to form the trench lower layers 35. Next, as shown in FIG. 1, the gate insulating films 16, the gate electrodes 18, the interlayer insulating films 20, the source electrode 22, and the drain electrode 24 are formed. Accordingly, the MOSFET of the first embodiment is completed.

When the trenches 14 are formed, the depths of the trenches 14 vary. When the trench lower layers 35 are formed, the ion implantation depths vary. Therefore, the positions of the lower ends of the trench lower layers 35 are affected by both the variation in the depth of the trenches 14 and the variation in the depth of the ion implantation. Therefore, the variation in the positions of the lower ends of the trench lower layers 35 in the z direction is large. In the MOSFET of the first embodiment, since the p-type deep layers 36 protrude downward below the trench lower layers 35, the positions of the lower ends of the trench lower layers 35 do not significantly affect the breakdown voltage of the MOSFET. Therefore, even if the variation in the positions of the lower ends of the trench lower layers 35 is large, the variation in the breakdown voltage of the MOSFET hardly occurs. Furthermore, the positions of the lower ends of the p-type deep layers 36 in the z direction greatly affect the breakdown voltage of the MOSFET. As described above, the p-type deep layers 36 are formed by implanting p-type impurities into the upper surface 12a of the semiconductor substrate 12. Therefore, the variation in the depths of the trenches 14 does not affect the positions of the lower ends of the p-type deep layers 36. Therefore, the variation in the positions of the lower ends of the p-type deep layers 36 is small. Therefore, the variation in the breakdown voltage of the MOSFET is small.

Next, modifications of the first embodiment will be described.

Figure 12:
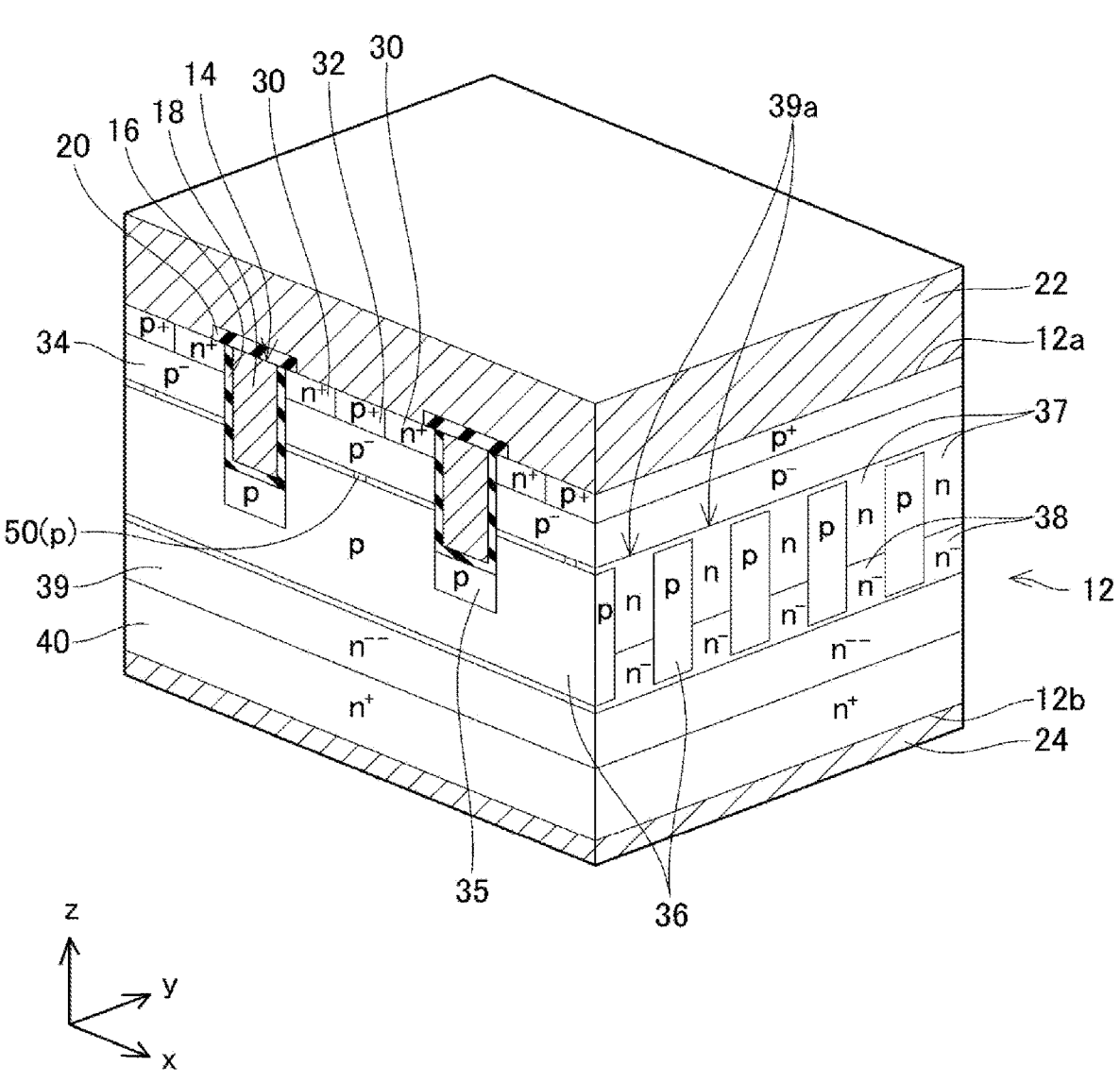
FIG. 12 is a cross-sectional perspective view of a MOSFET according to a first modification.
Figure 13:
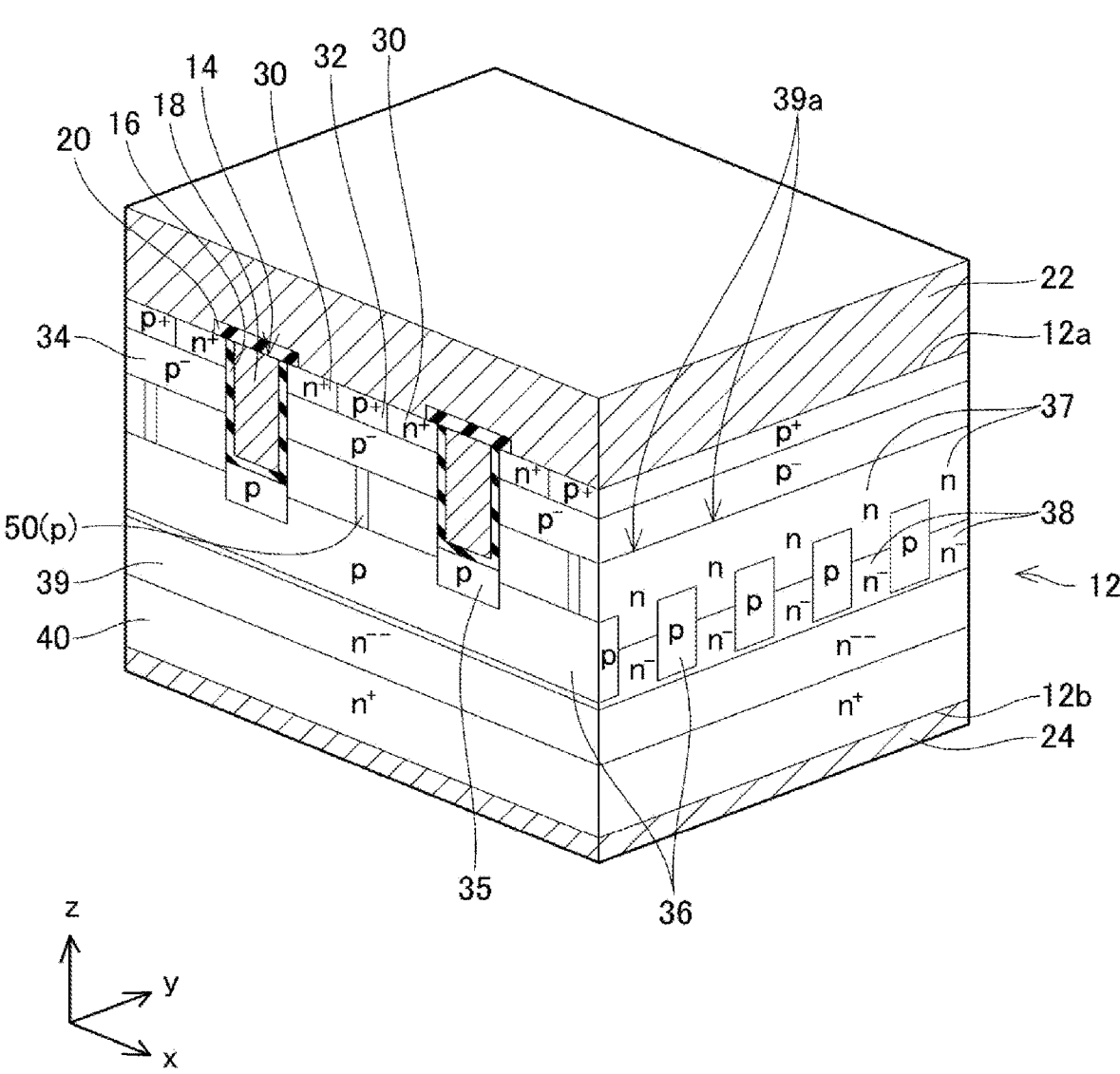
FIG. 13 is a cross-sectional perspective view of a MOSFET according to a second modification.

In the first embodiment, the upper ends of the p-type deep layers 36 are in contact with the body layer 34. However, as shown in FIG. 12 and FIG. 13, the upper ends of the p-type deep layers 36 may be separated downward from the lower surface of the body layer 34. In FIG. 12, the upper ends of the p-type deep layers 36 are disposed within a depth range below the lower surface of the body layer 34 and above the lower ends of the trenches 14. In FIG. 13, the upper ends of the p-type deep layers 36 are disposed within a depth range below the lower ends of the trenches 14 and above the lower ends of the trench lower layers 35. In FIG. 12 and FIG. 13, the n-type layer (for example, the high concentration layer 37) is disposed between the p-type deep layers 36 and the body layer 34. Between the p-type deep layers 36 and the body layer 34, connection layers 50 of p-type are partially disposed. The connection layers 50 connect the p-type deep layers 36 and the body layer 34. The p-type deep layers 36 are electrically connected to the source electrode 22 via the connection layers 50, the body layer 34, and the contact layers 32. As described above, the upper ends of the p-type deep layers 36 may be disposed at positions separated from the body layer 34 as long as the upper ends are located above the lower ends of the trench lower layers 35.

Figure 14:
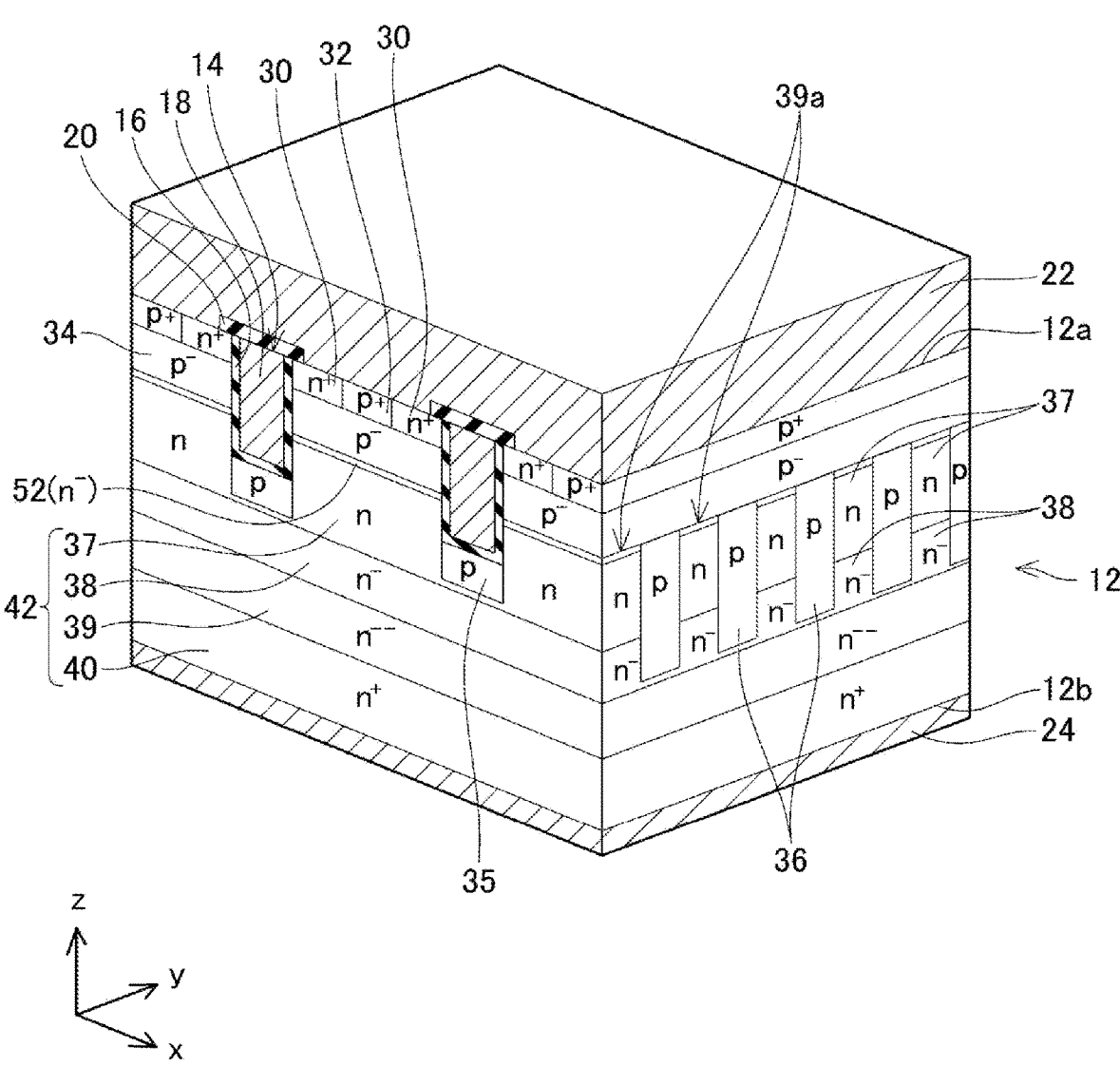
FIG. 14 is a cross-sectional perspective view of a MOSFET according to a third modification.
Figure 15:
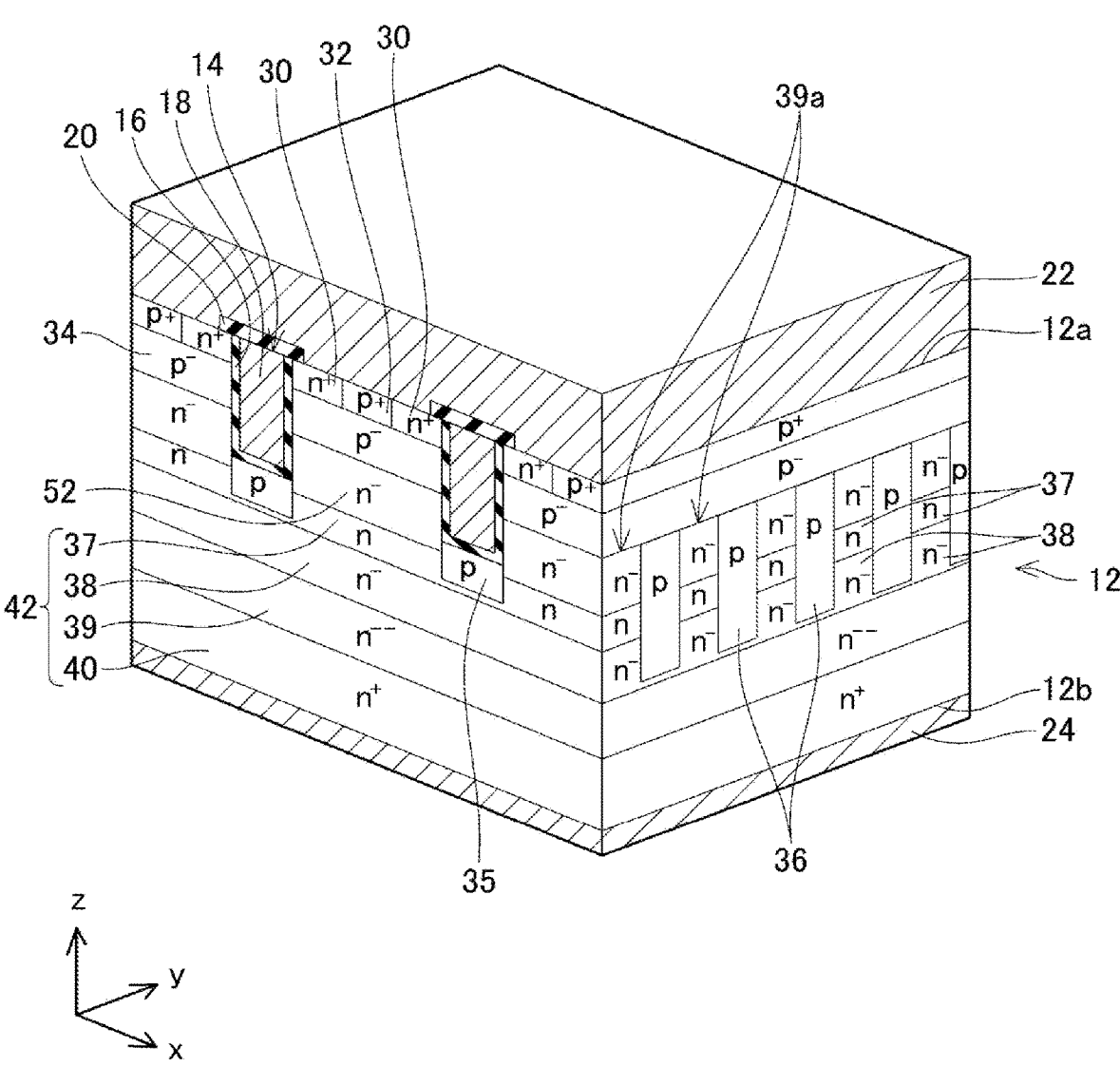
FIG. 15 is a cross-sectional perspective view of a MOSFET according to a fourth modification.

In the first embodiment, the high concentration layer 37 is in contact with the body layer 34. However, as shown in FIG. 14 and FIG. 15, the upper end of the high concentration layer 37 may be separated downward from the lower surface of the body layer 34. In FIG. 14, the upper end of the high concentration layer 37 is disposed within a depth range below the lower surface of the body layer 34 and above the lower ends of the trenches 14. In FIG. 15, the upper end of the high concentration layer 37 is disposed within a depth range below the lower ends of the trenches 14 and above the lower ends of the trench lower layers 35. In FIG. 14 and FIG. 15, an n-type layer 52 having an n-type impurity concentration lower than the n-type impurity concentration of the high concentration layer 37 is disposed between the high concentration layer 37 and the body layer 34. As described above, as long as the high concentration layer 37 is present in at least a part of the depth range in which both the trench lower layers 35 and the p-type deep layers 36 are present, the upper end of the high concentration layer 37 may be disposed at a position separated from the body layer 34.

Figure 16:
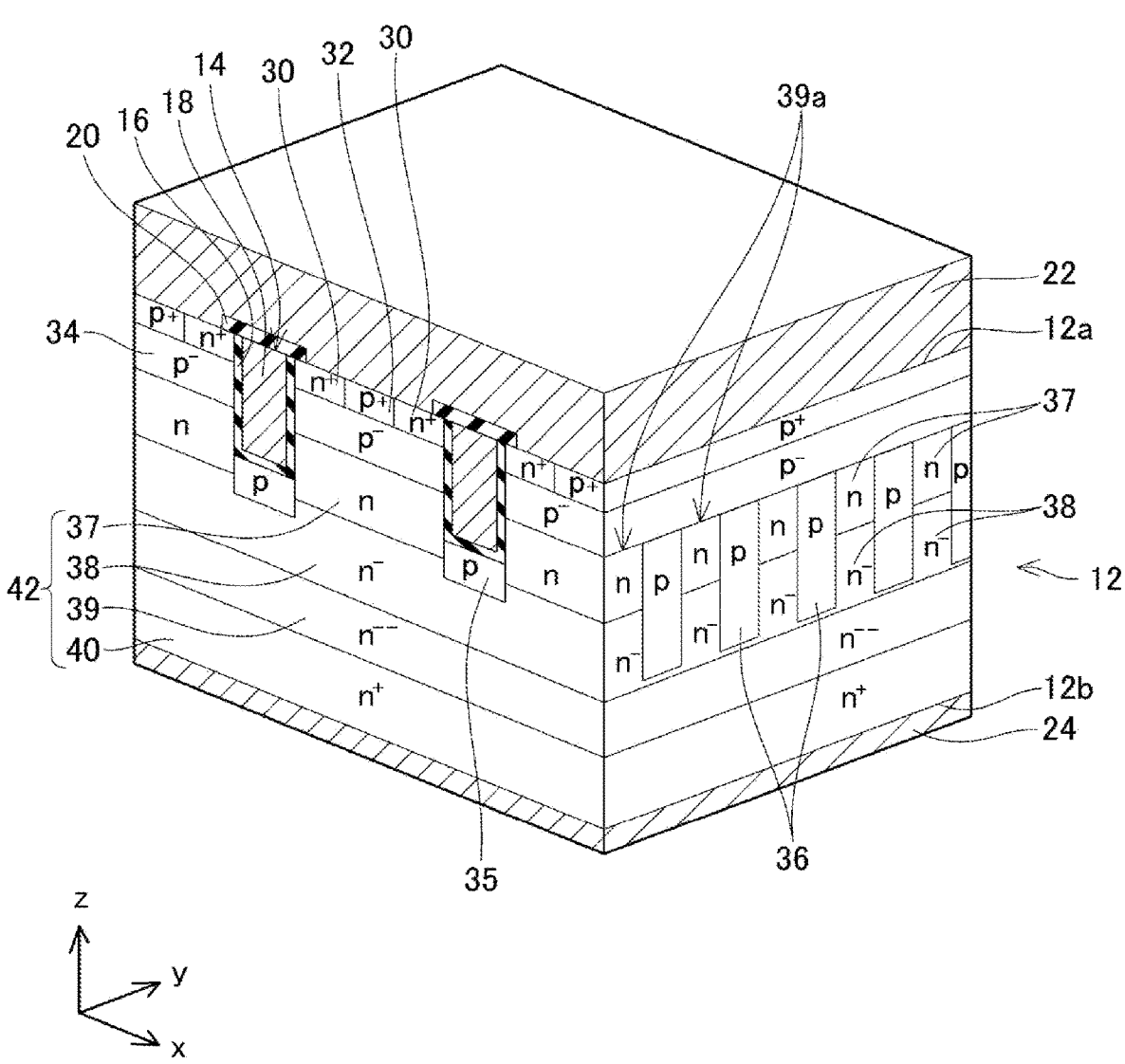
FIG. 16 is a cross-sectional perspective view of a MOSFET according to a fifth modification.

In the first embodiment, the lower end of the high concentration layer 37 (that is, the upper end of the intermediate concentration layer 38) is disposed below the lower ends of the trench lower layers 35. However, as shown in FIG. 16, the lower end of the high concentration layer 37 may be disposed within a depth range below the upper ends of the trench lower layers 35 and above the lower ends of the trench lower layers 35. Alternatively, the lower end of the high concentration layer 37 may be disposed at the same depth as the lower ends of the trench lower layers 35. As described above, as long as the high concentration layer 37 is present in at least a part of the depth range in which both the trench lower layers 35 and the p-type deep layers 36 are present, the lower end of the high concentration layer 37 may be disposed at any position in the z direction.

Figure 17:
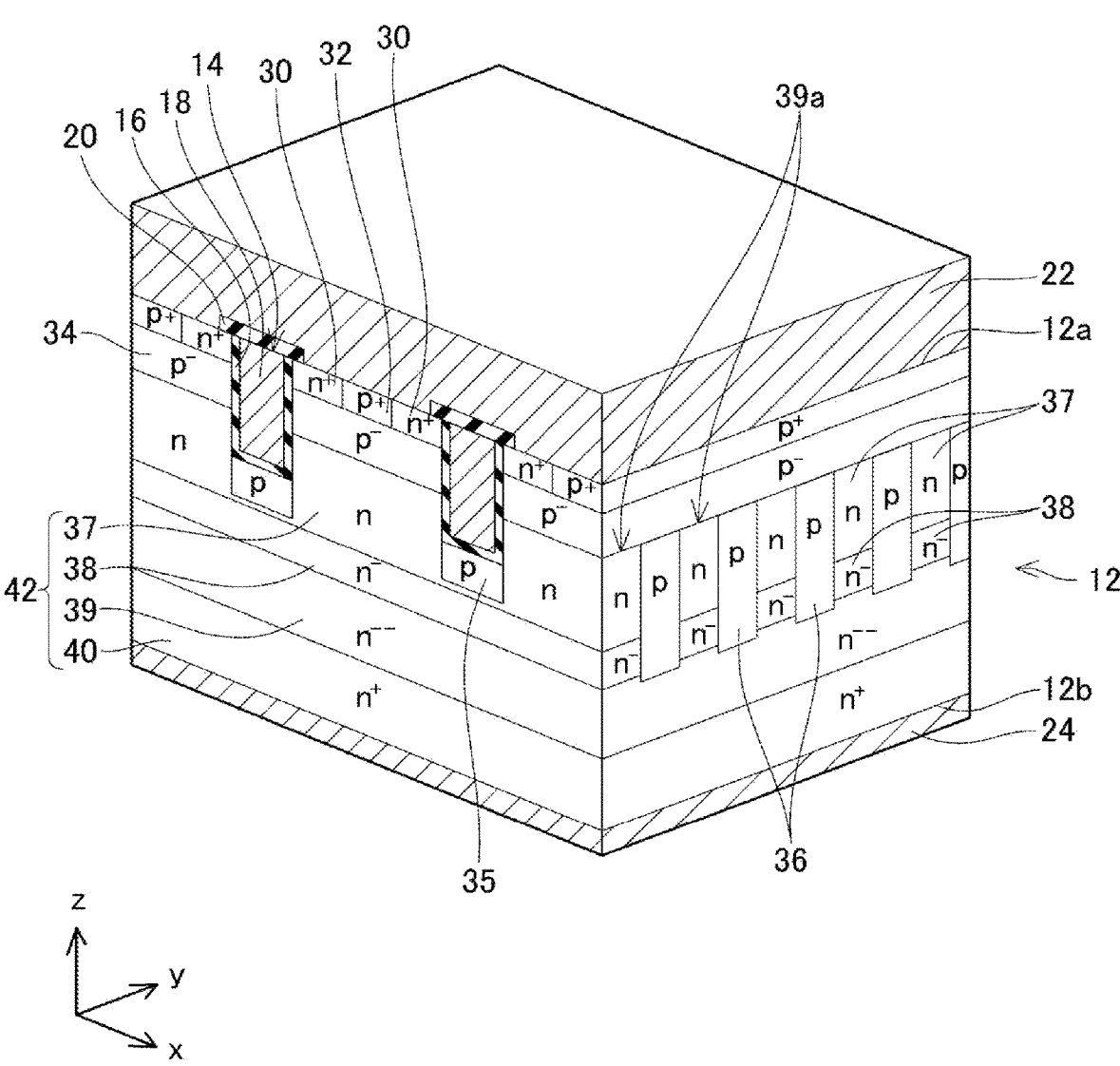
FIG. 17 is a cross-sectional perspective view of a MOSFET according to a sixth modification.

In the first embodiment, the lower end of the intermediate concentration layer 38 is disposed below the lower ends of the p-type deep layers 36. However, as shown in FIG. 17, the lower end of the intermediate concentration layer 38 may be disposed above the lower ends of the p-type deep layers 36. Alternatively, the lower end of the intermediate concentration layer 38 may be disposed at the same depth as the lower ends of the p-type deep layers 36. As described above, as long as the intermediate concentration layer 38 is present in at least a part of the depth range in which the p-type deep layers 36 are present and the trench lower layers 35 are not present, the lower end of the intermediate concentration layer 38 may be disposed at any position in the z direction.

Figure 18:
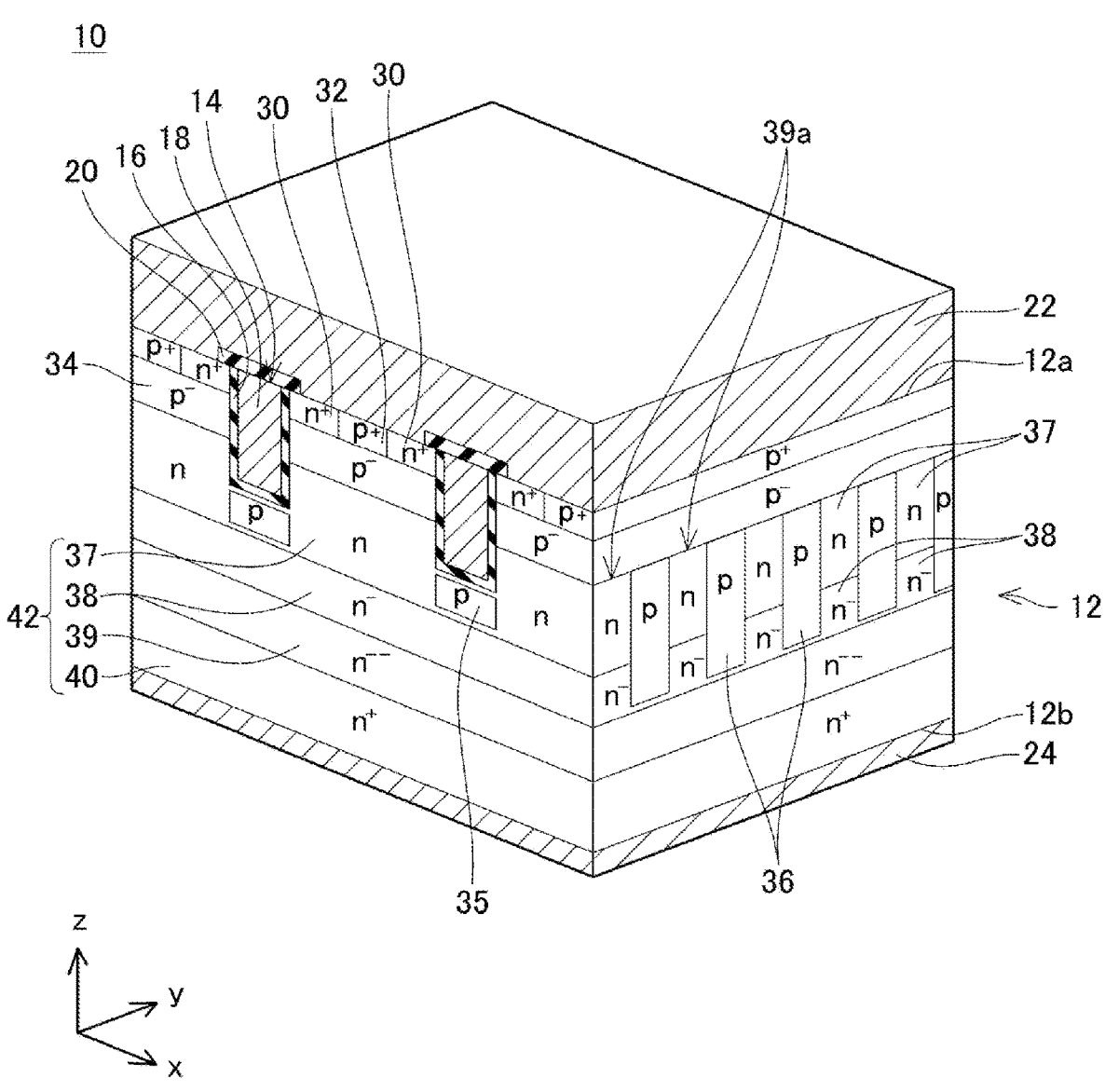
FIG. 18 is a cross-sectional perspective view of a MOS-FET according to a seventh modification.
Figure 19:
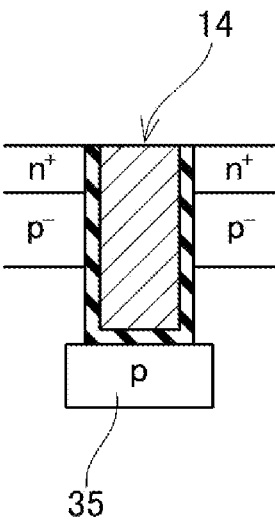
FIG. 19 is a cross-sectional view of a periphery of a trench in a MOSFET according to an eighth modification.
Figure 20:
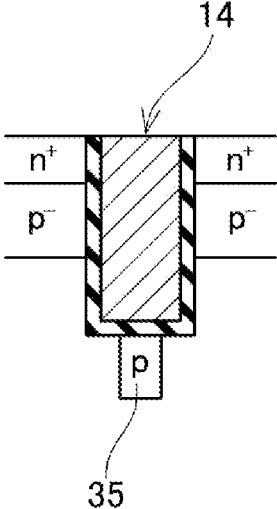
FIG. 20 is a cross-sectional view of a periphery of a trench in a MOSFET according to a ninth modification.
Figure 21:
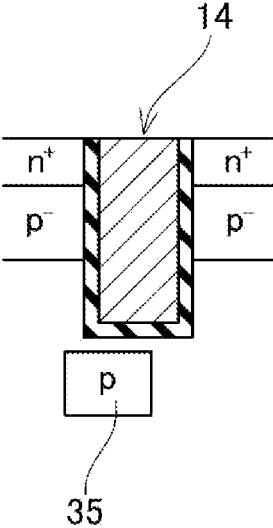
FIG. 21 is a cross-sectional view of a periphery of a trench in a MOSFET according to a tenth modification.

In the first embodiment, the trench lower layers 35 are in contact with the bottom surfaces of the trenches 14. However, as shown in FIG. 18, the trench lower layers 35 may be separated downward from the bottom surfaces of the trenches 14. As long as the trench lower layers 35 are disposed directly below the trenches 14, the upper ends of the trench lower layers 35 may be separated from the bottom surfaces of the trenches 14. In the first embodiment, the widths of the trench lower layers 35 are equal to the widths of the trenches 14. However, the widths of the trench lower layers 35 may be wider than the widths of the trenches 14 as shown in FIG. 19, or the widths of the trench lower layers 35 may be narrower than the widths of the trenches 14 as shown in FIG. 20. As shown in FIG. 21, the center of each of the trench lower layers 35 and the center of the corresponding trench 14 may be shifted from each other.

Second Embodiment

Figure 22:
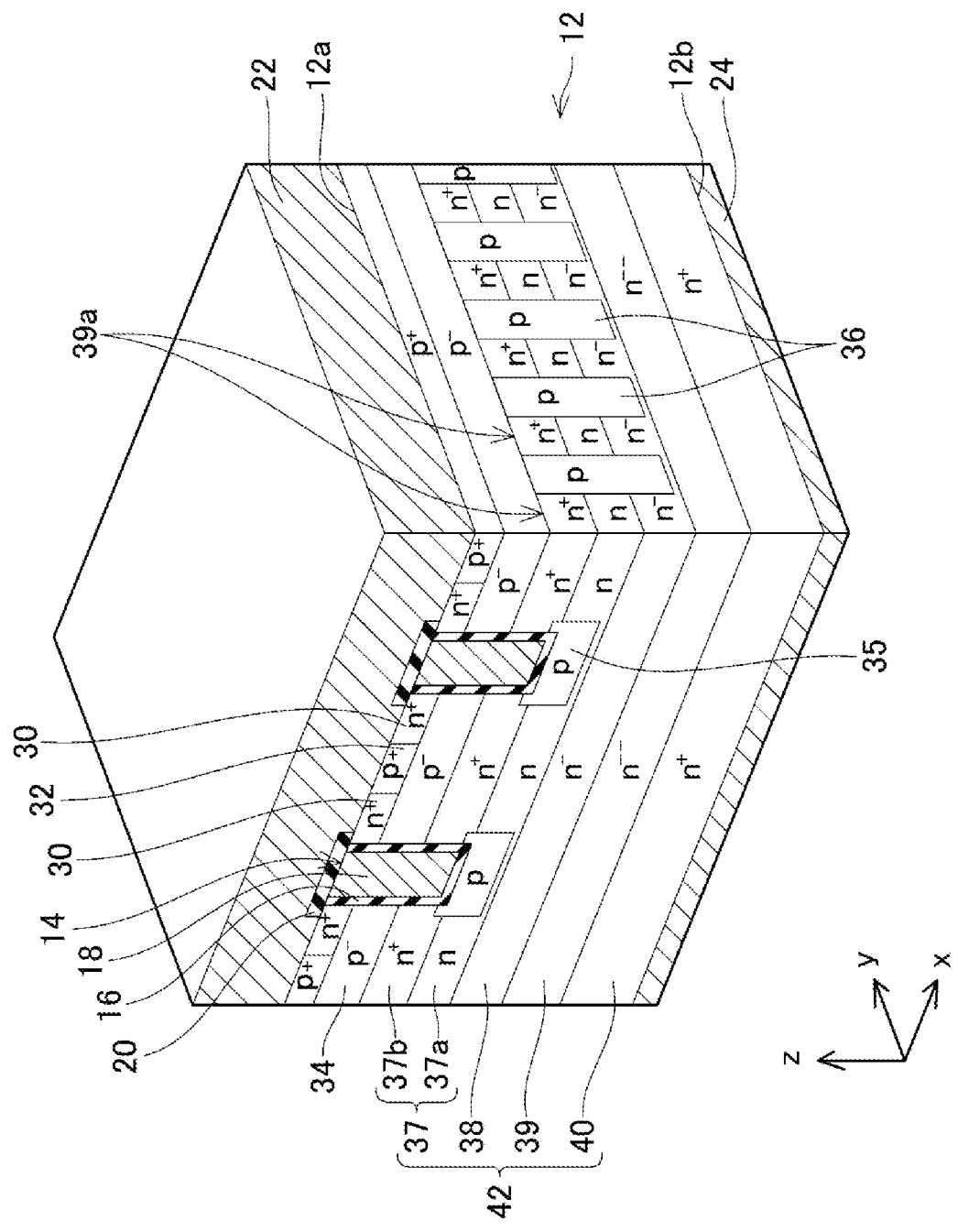
FIG. 22 is a cross-sectional perspective view of a MOS-FET according to a second embodiment.

In a MOSFET of a second embodiment shown in FIG. 22, the configurations of the trench lower layers 35 and the high concentration layer 37 are different from those of the first embodiment, and the other configurations are the same as those of the first embodiment. In the second embodiment, the widths of the trench lower layers 35 are wider than the widths of the bottom surfaces of the trenches 14. The trench lower layers 35 are in contact with the gate insulating films 16 at the lowermost portions of the side surfaces of the trenches 14. In the second embodiment, the high concentration layer 37 includes a first layer 37a and a second layer 37b. The first layer 37a has an n-type impurity concentration higher than the n-type impurity concentration of the intermediate concentration layer 38. The second layer 37b has an n-type impurity concentration higher than the n-type impurity concentration of the first layer 37a. The second layer 37b is in contact with the lower surface of the body layer 34. The second layer 37b is in contact with the gate insulating films 16 at positions below the body layer 34. The lower end of the second layer 37b is disposed above the lower ends of the trenches 14. The first layer 37a is disposed below the second layer 37b. The first layer 37a is in contact with the lower surface of the second layer 37b. The first layer 37a is in contact with the side surfaces and the lower surfaces of the trench lower layers 35. The first layer 37a is in contact with the upper surface of the intermediate concentration layer 38.

In the MOSFET of the second embodiment, the trench lower layers 35 are in contact with the gate insulating films 16 not only at the bottom surfaces of the trenches 14 but also at the lowermost portions of the side surfaces of the trenches 14. Therefore, the electric field applied to the gate insulating films 16 covering the bottom surfaces of the trenches 14 is more effectively restricted.

In a state where the MOSFET of the second embodiment is turned on, electrons passing through the channel flow into the second layer 37b. Since the n-type impurity concentration of the second layer 37b is high, the resistance of the second layer 37b is low. Therefore, electrons that have passed through the channel easily diffuse in the lateral direction along the second layer 37*b*. Therefore, electrons flow downward in the first layer 37*a* in a state of being diffused over a wide range in the lateral direction. Thus, the on-voltage of the MOSFET of the second embodiment is further reduced.

Figure 23:
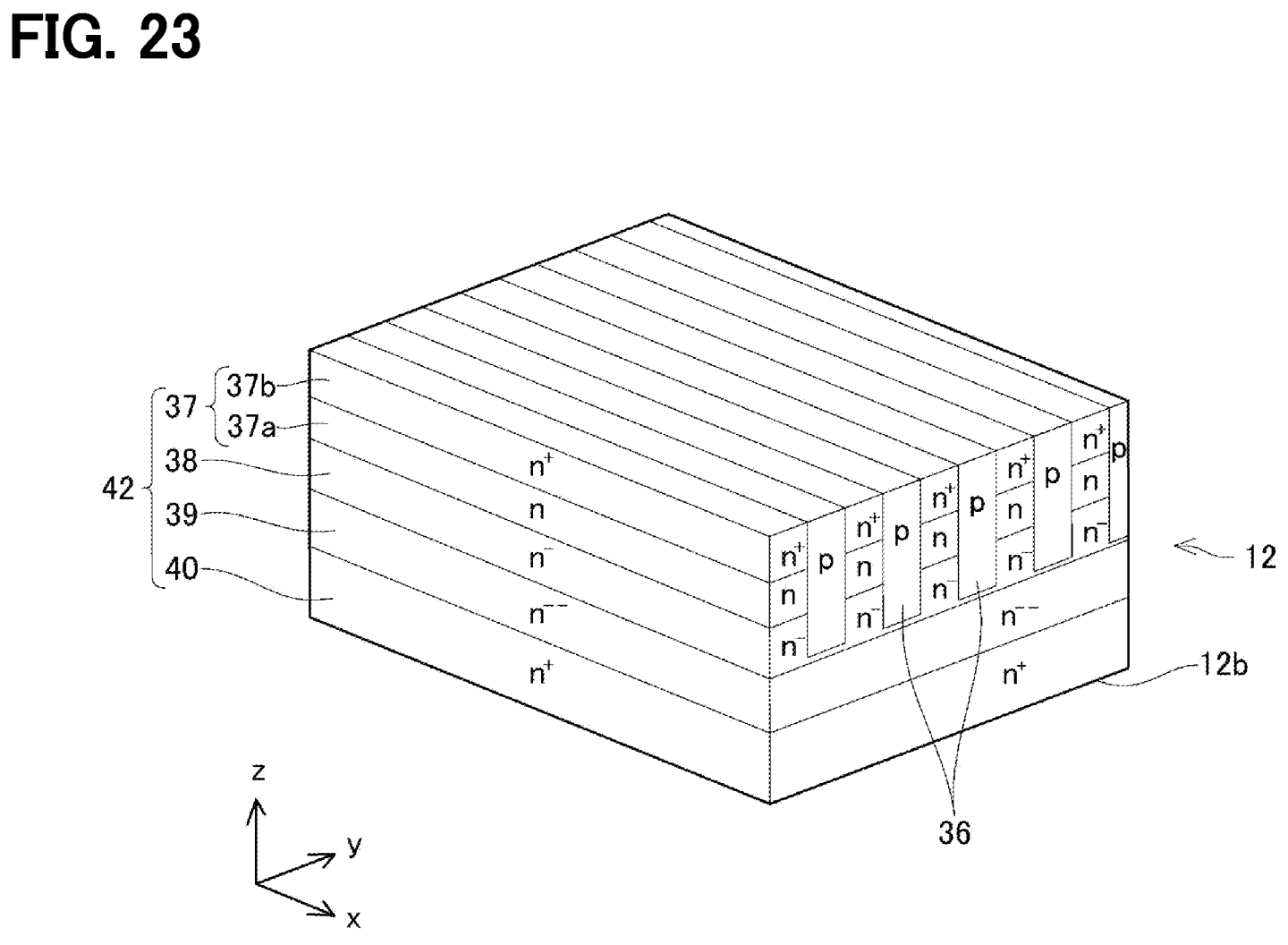
Figure 24:
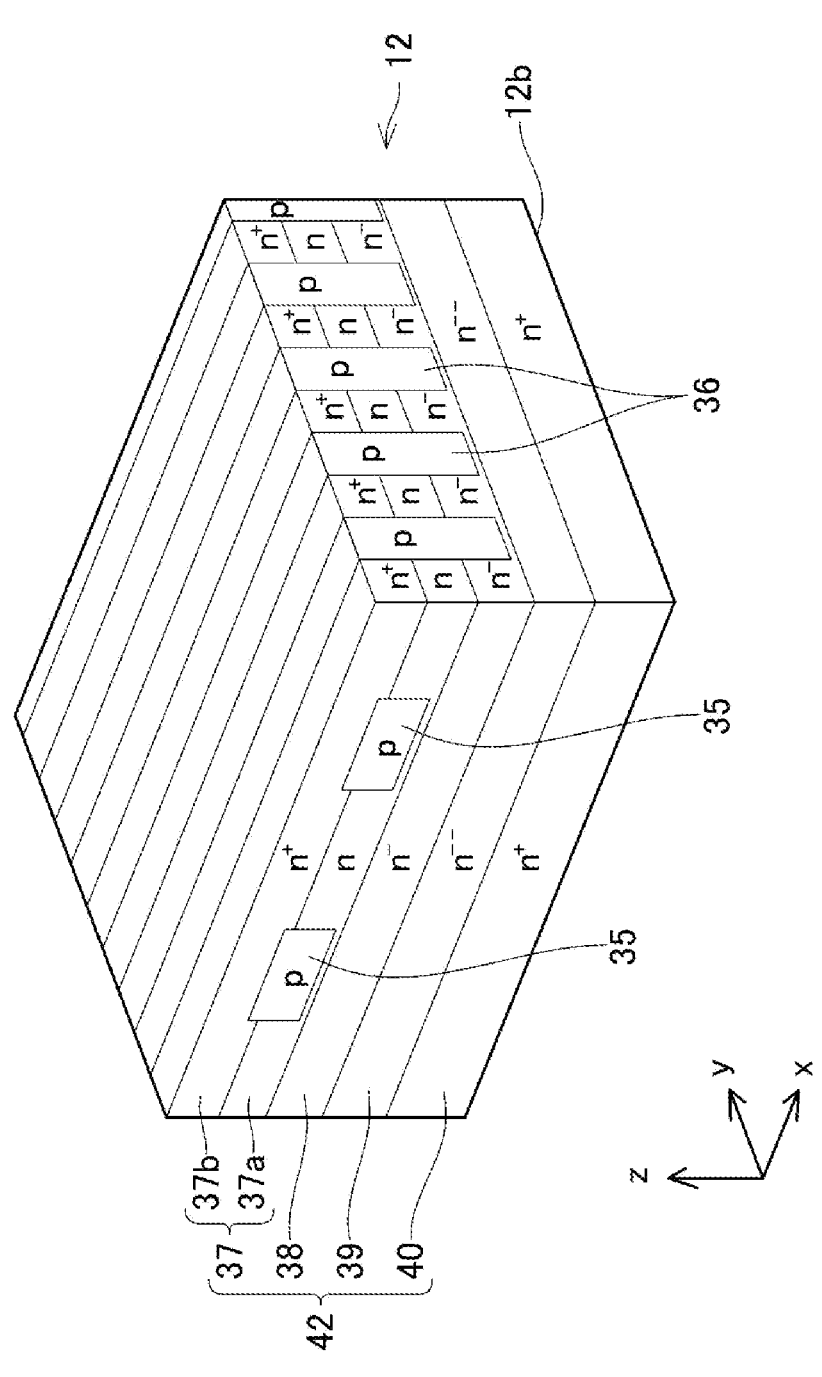
FIG. 24 is a diagram for explaining the manufacturing method of the MOSFET according to the second embodiment.
Figure 25:
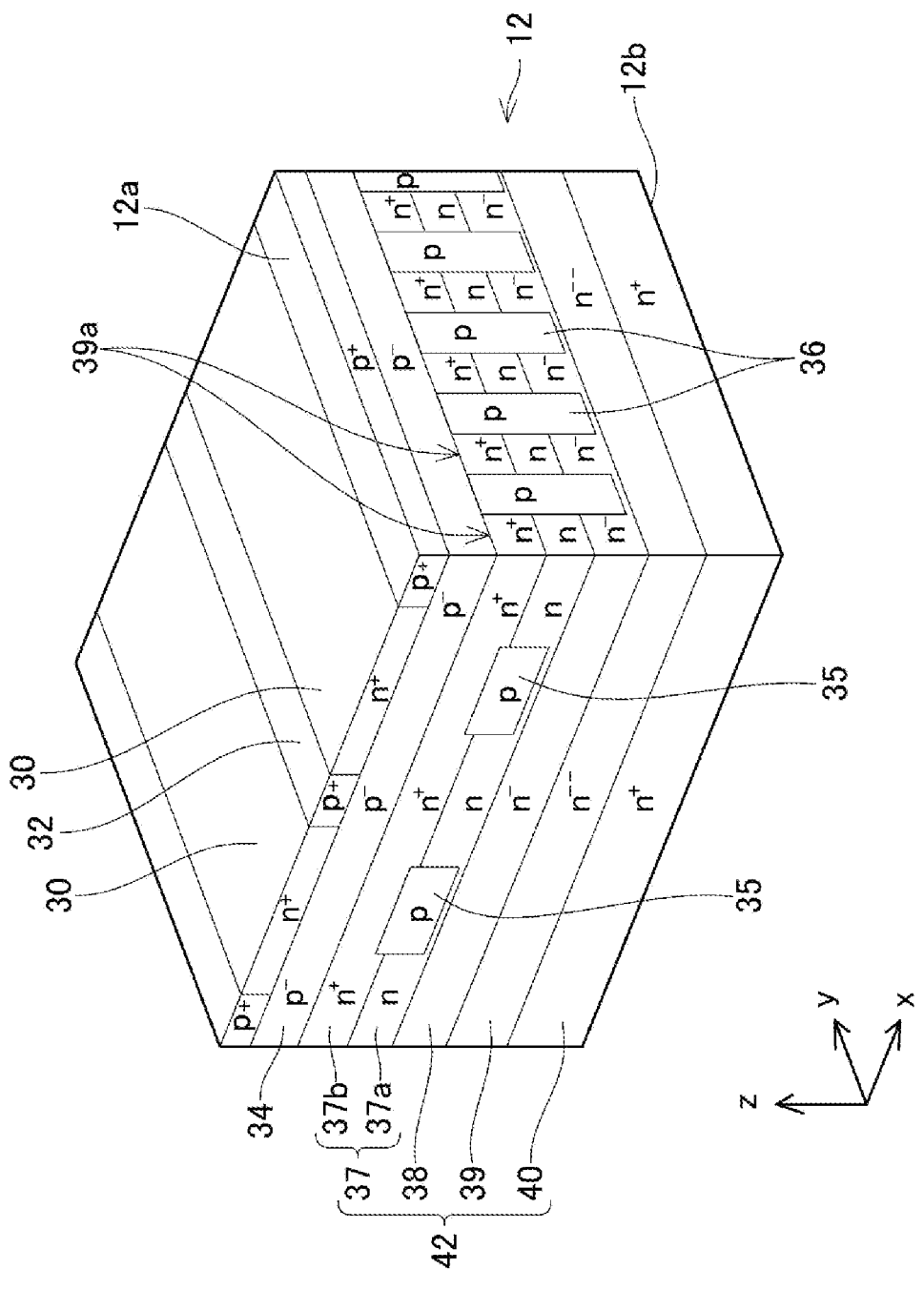
FIG. 25 is a diagram for explaining the manufacturing method of the MOSFET according to the second embodiment.
Figure 26:
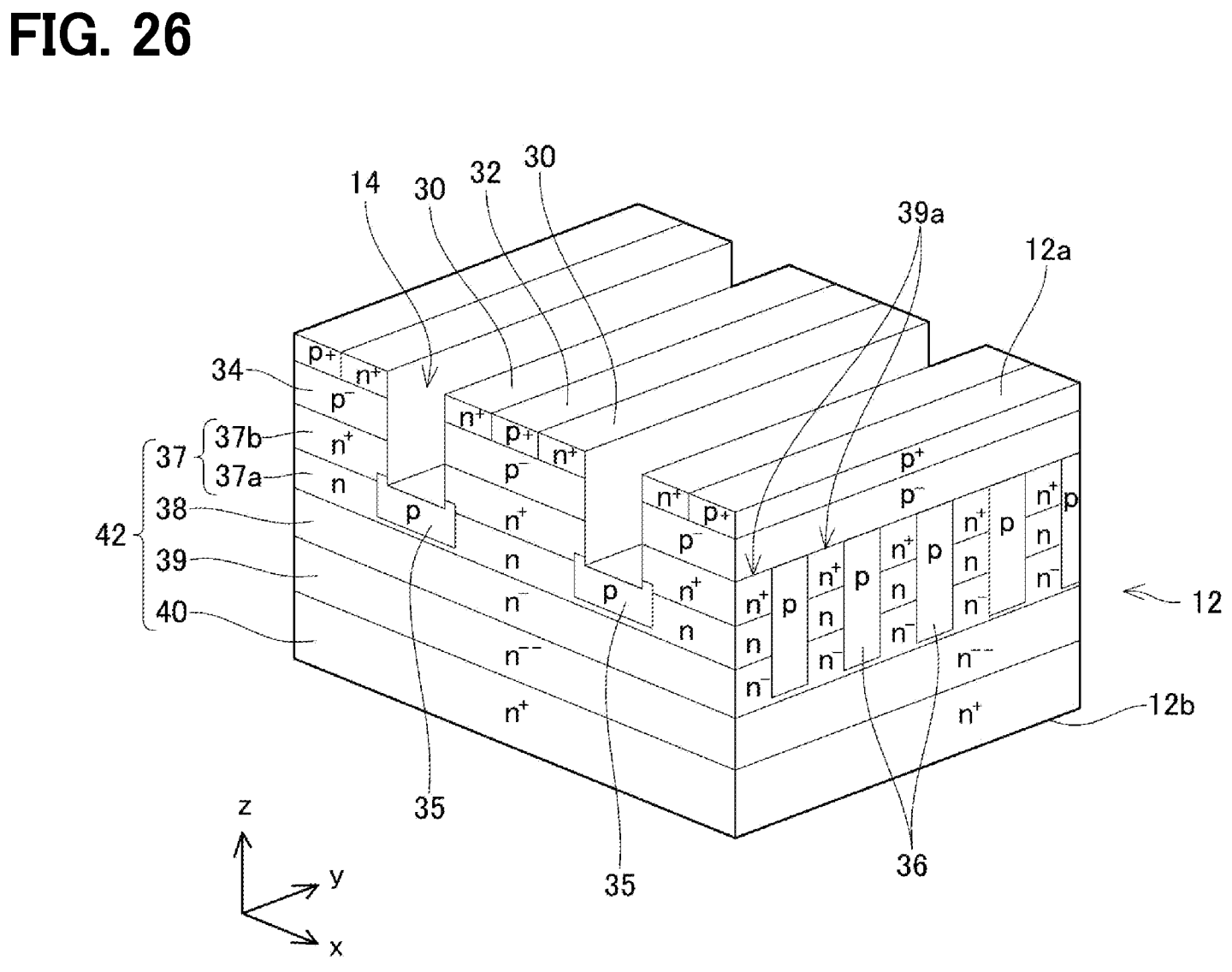

The following describes a method of manufacturing the MOSFET according to the second embodiment. First, as shown in FIG. 23, the intermediate concentration layer 38, the high concentration layer 37, and the p-type deep layers 36 are formed by ion implantation into the drift layer 39. The first layer 37*a* and the second layer 37*b* are formed by changing the ion implantation concentration according to the depth at the time of ion implantation into the high concentration layer 37. Next, as shown in FIG. 24, the trench lower layers 35 of p-type are formed in the high concentration layer 37 by ion implantation. Next, as shown in FIG. 25, an epitaxial layer is formed on the semiconductor substrate 12, and ion implantation is performed on the formed epitaxial layer to form the body layer 34, the source layers 30, and the contact layers 32. Next, as shown in FIG. 26, the trenches 14 are formed by etching the upper surface 12*a* of the semiconductor substrate 12. The depths of the trenches 14 are adjusted so that the bottom surfaces of the trenches 14 are located below the lower surface of the second layer 37*b* and are included in the trench lower layers 35. Next, as shown in FIG. 22, the gate insulating films 16, the gate electrodes 18, the interlayer insulating films 20, the source electrode 22, and the drain electrode 24 are formed. Accordingly, the MOSFET of the second embodiment is completed.

In the second embodiment, the second layer 37*b* is present above the lower ends of the trenches 14. Therefore, when the second layer 37*b* is formed, the n-type impurity can be restricted from being implanted into the depth in the vicinity of the lower ends of the trenches 14. Therefore, the trench lower layers 35 of p-type can be appropriately formed, and the electric field applied to the gate insulating films 16 can be effectively restricted by the trench lower layers 35.

In the second embodiment, the configuration of each component may be modified as shown in FIGS. 12 to 14 and 16 to 21.

Although the embodiments have been described in detail above, these are merely examples and do not limit the scope of claims. The techniques described in the claims include various modifications and modifications of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings achieve a plurality of objectives at the same time, and achieving one of the objectives itself has technical usefulness.

What is claimed is:

1. A field effect transistor comprising:
a semiconductor substrate having a plurality of trenches provided from an upper surface of the semiconductor substrate;
a gate insulating film covering an inner surface of each of the plurality of trenches;
a gate electrode disposed inside each of the plurality of trenches and being insulated from the semiconductor substrate by the gate insulating film; and
a source electrode being in contact with the upper surface of the semiconductor substrate, wherein
the semiconductor substrate includes:

a source layer of n-type being in contact with the source electrode and in contact with the gate insulating film on a side surface of each of the plurality of trenches;
a body layer of p-type being in contact with the gate insulating film at a position below the source layer;
a plurality of trench lower layers of p-type;
a plurality of deep layers of p-type; and
a drain-side layer of n-type,
each of the plurality of trench lower layers is disposed directly below a corresponding one of the plurality of trenches, extends along a longitudinal direction of the plurality of trenches when the semiconductor substrate is viewed from above, and is electrically connected to the source electrode,
each of the plurality of deep layers is disposed directly below the body layer, extends from a position above a lower end of each of the plurality of trench lower layers to a position below the lower end of each of the plurality of trench lower layers, extends along a first direction intersecting the plurality of trenches when the semiconductor substrate is viewed from above, intersects each of the plurality of trench lower layers, and is electrically connected to the source electrode,
respective deep layers in the plurality of deep layers are arranged at intervals along a second direction orthogonal to the first direction when the semiconductor substrate is viewed from above,
the drain-side layer is distributed from a position in contact with a lower surface of the body layer to a position below a lower end of each of the plurality of deep layers through each of the intervals between the deep layers, and is in contact with the gate insulating film at a position below the body layer,
the drain-side layer includes:
a high concentration layer of n-type;
an intermediate concentration layer of n-type disposed directly below the high concentration layer and having an n-type impurity concentration lower than an n-type impurity concentration of the high concentration layer; and
a drift layer of n-type disposed directly below the intermediate concentration layer and having an n-type impurity concentration lower than the n-type impurity concentration of the intermediate concentration layer,
the high concentration layer is distributed in at least a part of a depth range in which both the plurality of deep layers and the plurality of trench lower layers are present, and is in contact with a side surface of each of the plurality of trench lower layers and a side surface of each of the plurality of deep layers, and
the intermediate concentration layer is distributed in at least a part of a depth range between a lower end of the high concentration layer and the lower end of each of the plurality of deep layers, and is in contact with the side surface of each of the plurality of deep layers.

2. The field effect transistor according to claim 1, wherein the high concentration layer includes:
a first layer having an n-type impurity concentration higher than the n-type impurity concentration of the intermediate concentration layer; and
a second layer having an n-type impurity concentration higher than the n-type impurity concentration of the first layer,
the second layer is disposed above the lower end of each of the plurality of trenches, and the first layer is disposed between a lower end of the second layer and an upper end of the intermediate concentration layer.

3. The field effect transistor according to claim 1, wherein a p-type impurity concentration of each of the plurality of trench lower layers is higher than a p-type impurity concentration of each of the plurality of deep layers.

4. The field effect transistor according to claim 3, wherein the p-type impurity concentration of each of the plurality of deep layers is set so that a non-depleted region remains in each of the plurality of deep layers in a state where a saturation current flows through the field effect transistor.

\* \* \* \* \*